(12) United States Patent
Chiba et al.

(10) Patent No.: US 10,763,074 B2
(45) Date of Patent: *Sep. 1, 2020

(54) CHARGED PARTICLE BEAM APPARATUS, OBSERVATION METHOD USING CHARGED PARTICLE BEAM APPARATUS, AND PROGRAM

(71) Applicant: HITACHI HIGH-TECHNOLOGIES CORPORATION, Tokyo (JP)

(72) Inventors: Hiroyuki Chiba, Tokyo (JP); Yoshinobu Hoshino, Tokyo (JP); Shigeru Kawamata, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/576,252

(22) Filed: Sep. 19, 2019

(65) Prior Publication Data

US 2020/0013583 A1    Jan. 9, 2020

Related U.S. Application Data

(63) Continuation of application No. 15/773,445, filed as application No. PCT/JP2015/082989 on Nov. 25, 2015, now Pat. No. 10,453,650.

(51) Int. Cl.
*H01J 37/244*    (2006.01)
*H01J 37/22*    (2006.01)
(Continued)

(52) U.S. Cl.
CPC .......... *H01J 37/244* (2013.01); *H01J 37/20* (2013.01); *H01J 37/22* (2013.01); *H01J 37/24* (2013.01);
(Continued)

(58) Field of Classification Search
None
See application file for complete search history.

(56) References Cited

U.S. PATENT DOCUMENTS

| 5,523,567 | A | * | 6/1996 | Kawamata | H01J 37/28 |
| | | | | | 250/310 |
| 8,426,812 | B2 | * | 4/2013 | Bean | G02B 21/367 |
| | | | | | 250/306 |
| 2012/0104250 | A1 | * | 5/2012 | Bean | H01J 37/26 |
| | | | | | 250/307 |

FOREIGN PATENT DOCUMENTS

| CN | 102543638 A | * | 7/2012 | ........... H01J 37/244 |
| CN | 102543638 A | | 7/2012 | |

(Continued)

OTHER PUBLICATIONS

Chinese Office Action dated Nov. 14, 2019 for the Chinese Patent Application No. 201580084713.3.

(Continued)

*Primary Examiner* — Andrew Smyth
(74) *Attorney, Agent, or Firm* — Volpe and Koenig, P.C.

(57) ABSTRACT

A charged particle beam apparatus includes: an optical system that irradiates a sample mounted on a sample stage with a charged particle beam; at least one detector that detects a signal generated from the sample; an imaging device that acquires an observation image; a mechanism for changing observation positions in the sample which has at least one of a stage that moves the sample stage and a deflector that changes the charged particle beam's irradiation position; a display unit that displays an operation screen provided with an observation image displaying portion that displays the observation image and an observation position displaying portion that displays an observation position of the observation image; and a controller that controls display processing of the operation screen. The controller superim- (Continued)

poses and displays on the observation position displaying portion a plurality of observation position images at different magnifications, based on the observation images' magnifications and coordinates.

3 Claims, 11 Drawing Sheets

(51) Int. Cl.
*H01J 37/28* (2006.01)
*H01J 37/24* (2006.01)
*H01J 37/20* (2006.01)
*H01J 37/29* (2006.01)

(52) U.S. Cl.
CPC .............. *H01J 37/28* (2013.01); *H01J 37/29* (2013.01); *H01J 2237/20214* (2013.01); *H01J 2237/221* (2013.01); *H01J 2237/2442* (2013.01); *H01J 2237/2448* (2013.01); *H01J 2237/24475* (2013.01); *H01J 2237/2823* (2013.01)

(56) References Cited

FOREIGN PATENT DOCUMENTS

| | | | | |
|---|---|---|---|---|
| CN | 102543638 B | * | 3/2016 | ........... G02B 21/367 |
| JP | 07-130319 A | | 5/1995 | |
| JP | 10-003875 A | | 1/1998 | |
| JP | 10003875 A | * | 1/1998 | |
| JP | 2004-158392 A | | 6/2004 | |
| JP | 2004158392 A | * | 6/2004 | |
| JP | 2012-099481 A | | 5/2012 | |
| JP | 2012099481 A | * | 5/2012 | ........... H01J 37/222 |
| JP | 2014-229587 A | | 12/2014 | |
| JP | 2014229587 A | * | 12/2014 | .............. H01J 37/28 |

OTHER PUBLICATIONS

Chinese Office Action dated Apr. 28, 2019 for the Chinese Patent Application No. 201580084713.3.

International Search Report for WO2017/090100 A1, dated Feb. 16, 2016.

* cited by examiner

[Fig. 1]
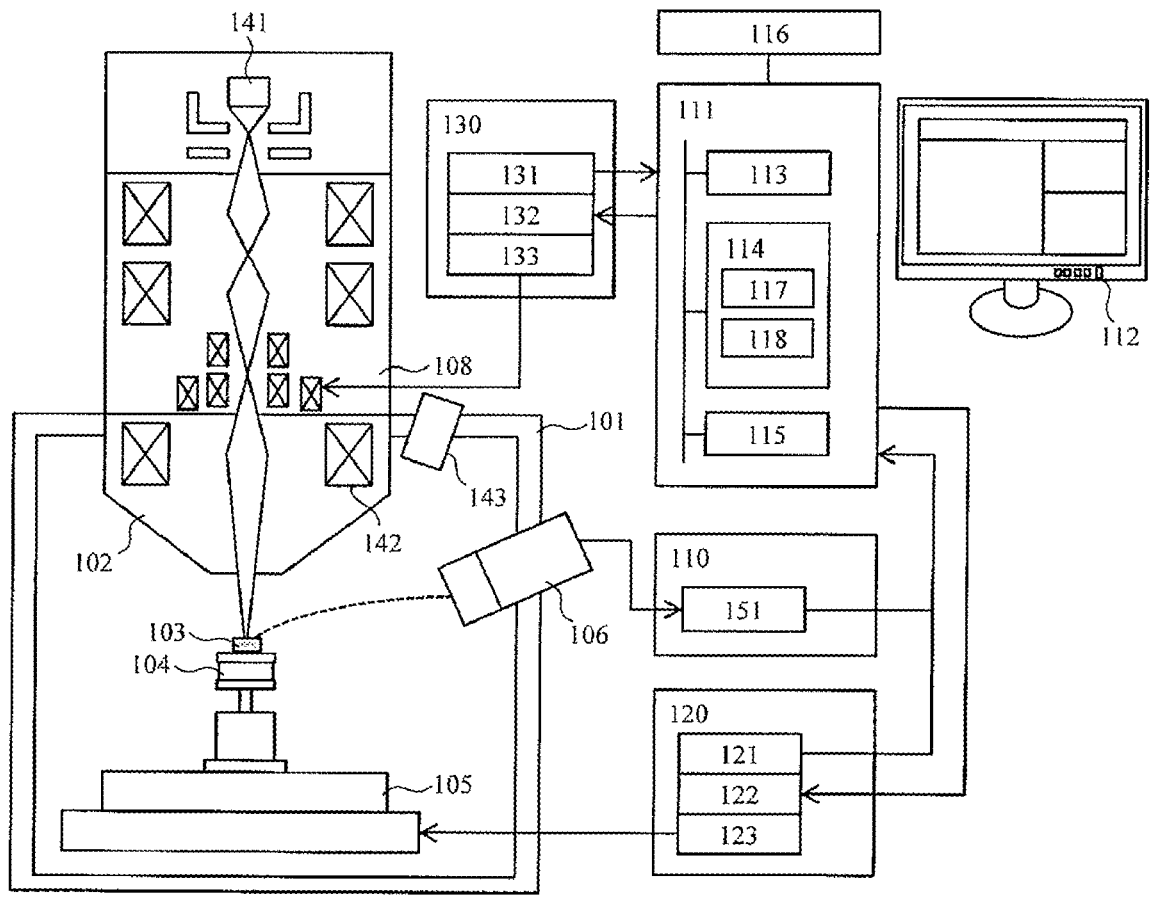
[Fig. 2]
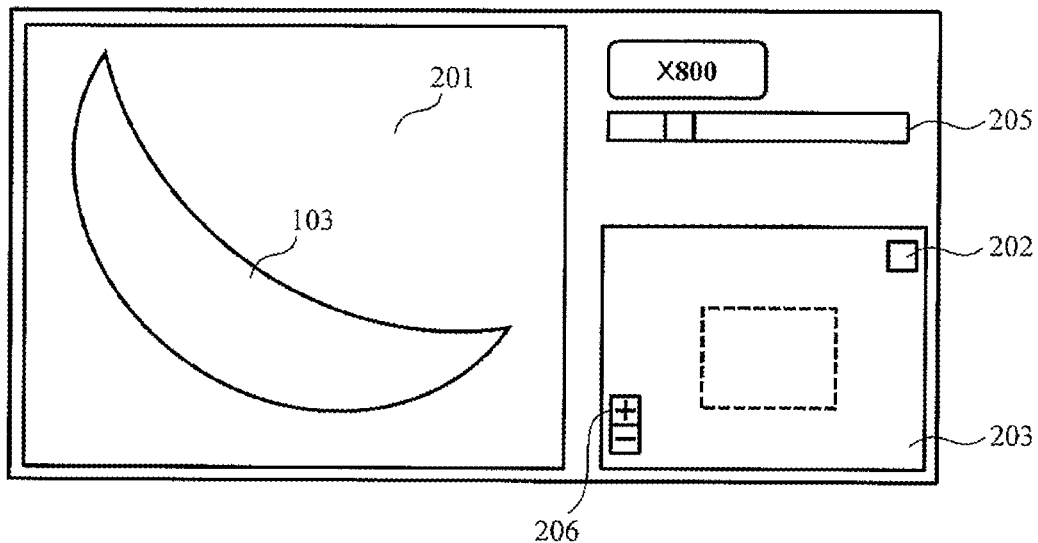

[Fig. 3]
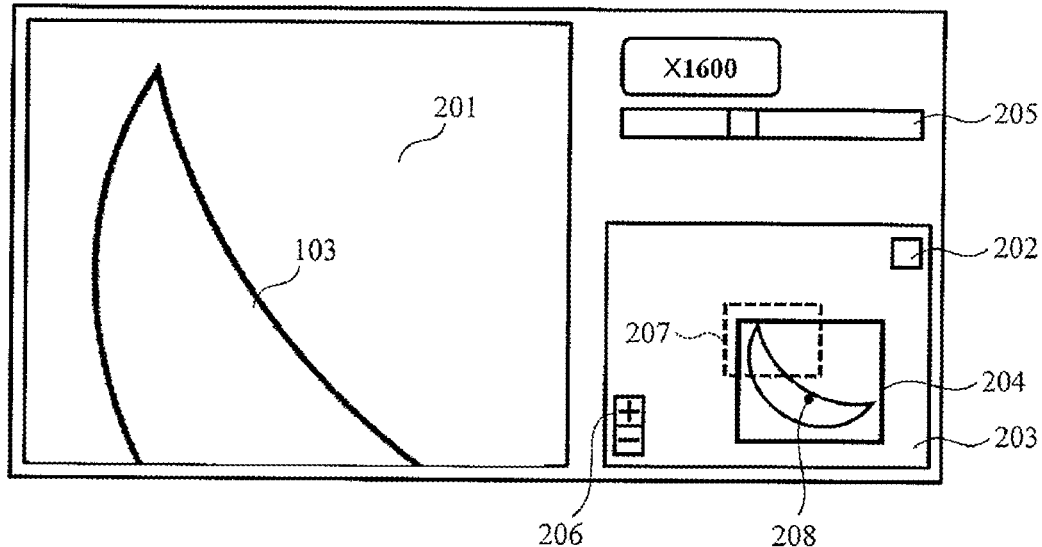
[Fig. 4]
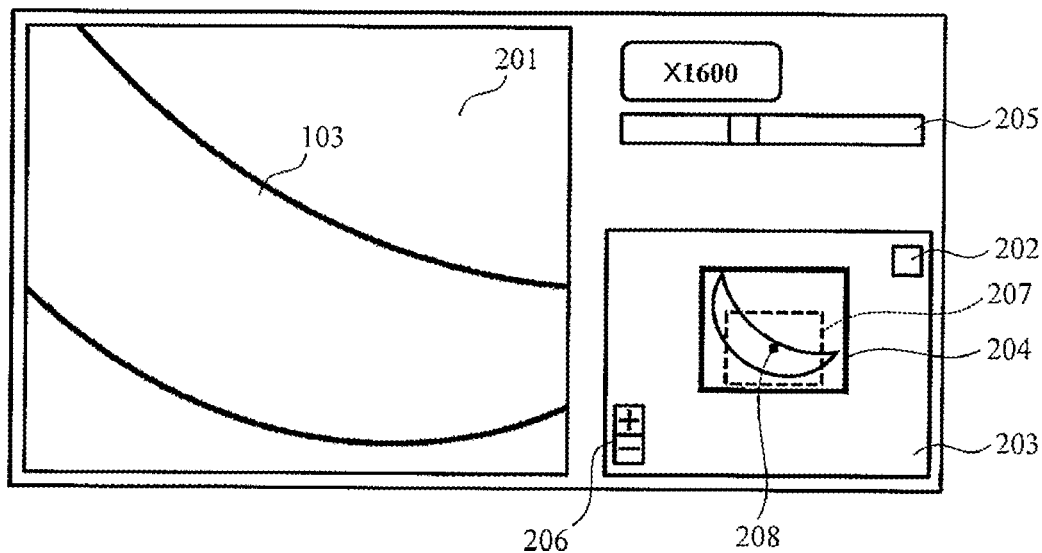

[Fig. 5]
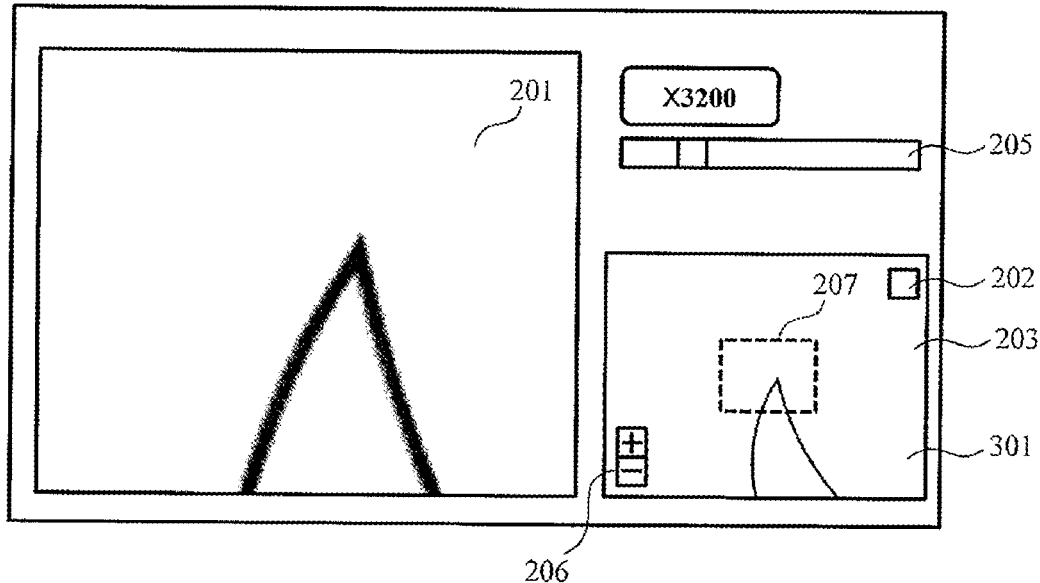
[Fig. 6]
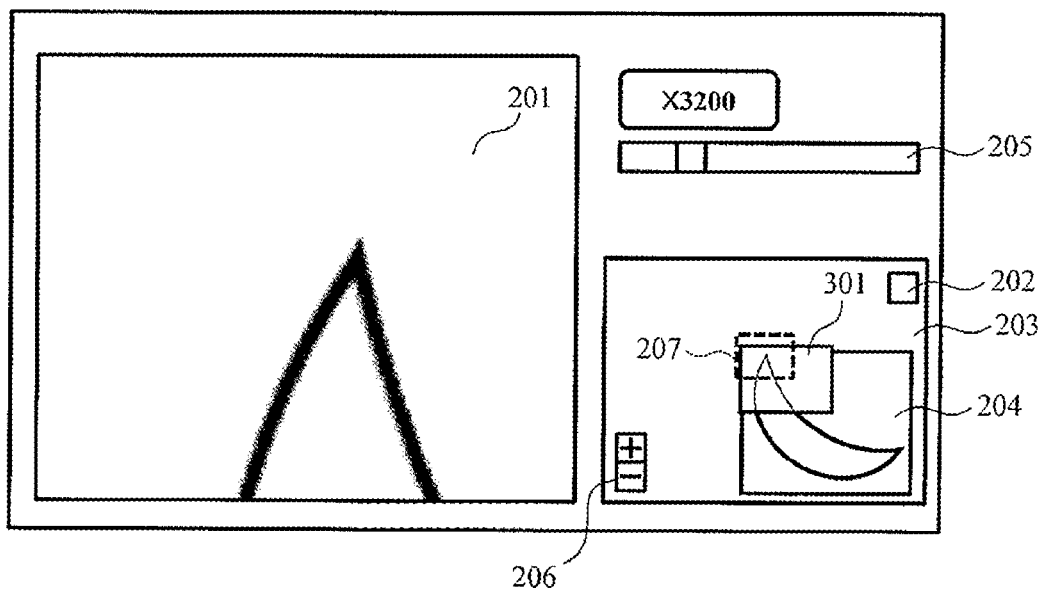

[Fig. 7]
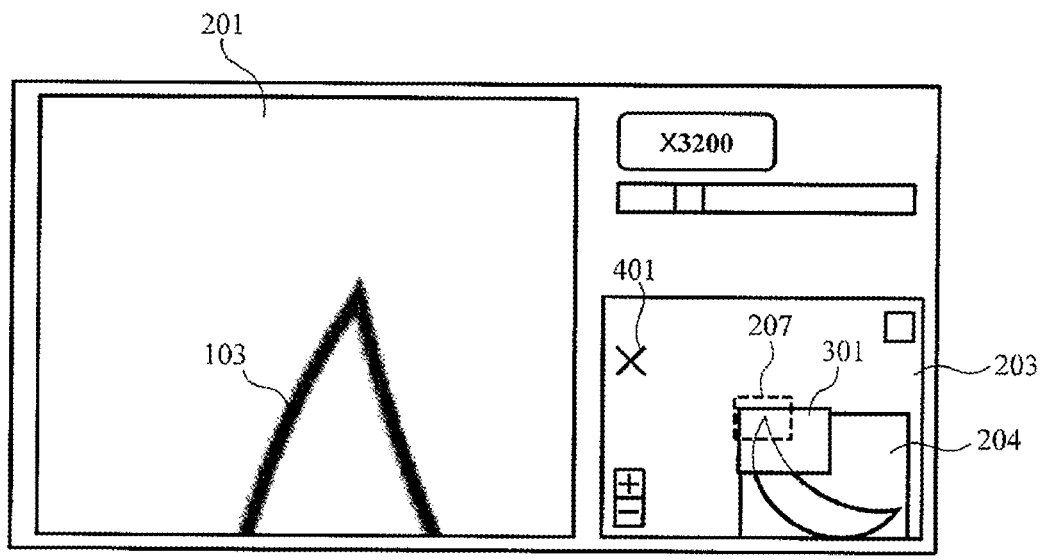
[Fig. 8]
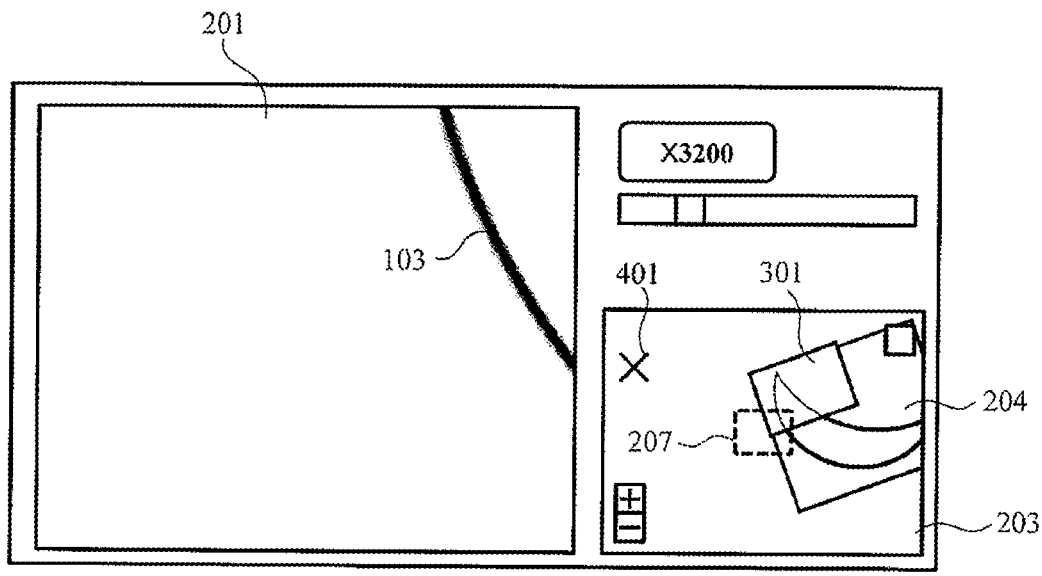

[Fig. 9]
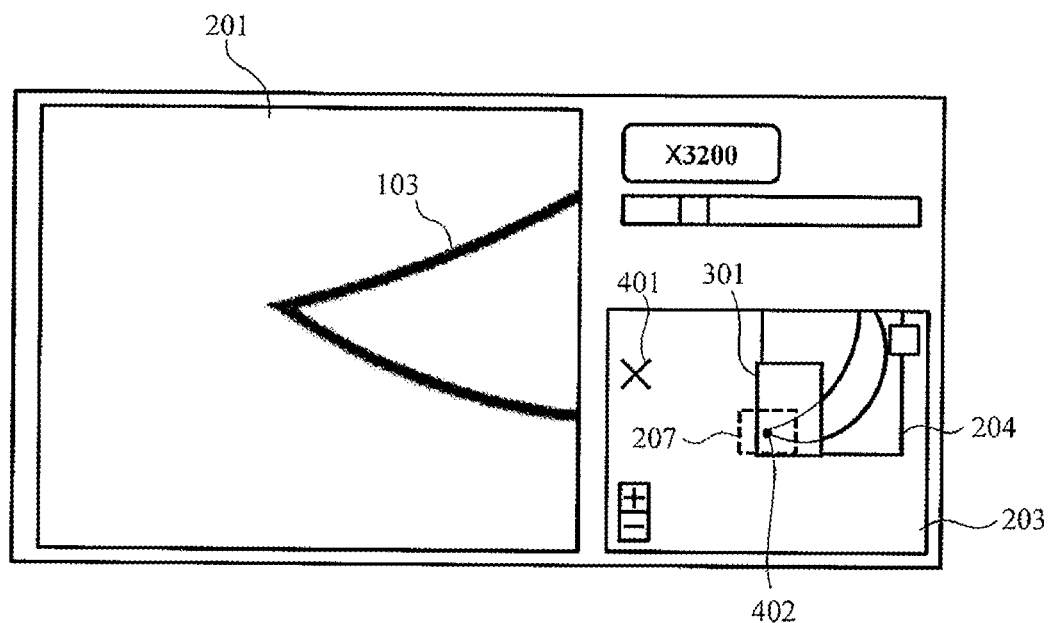
[Fig. 10]
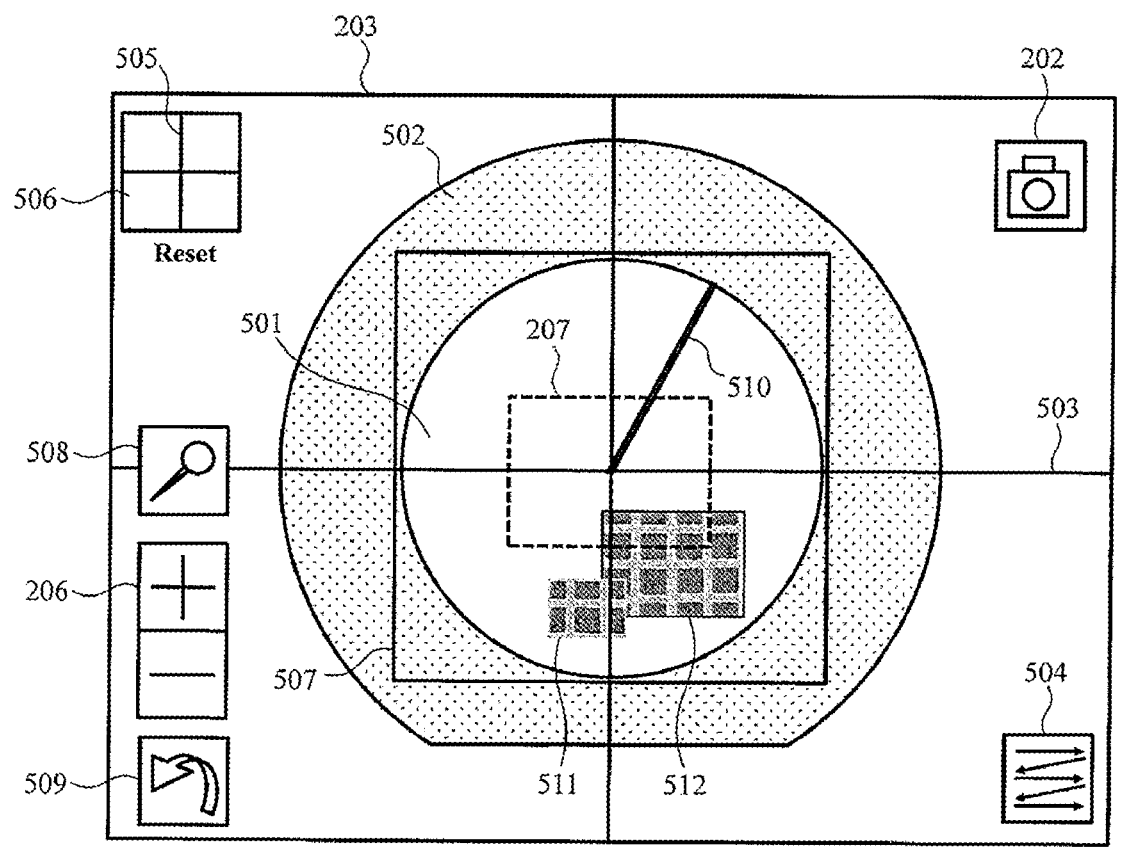

[Fig. 11]
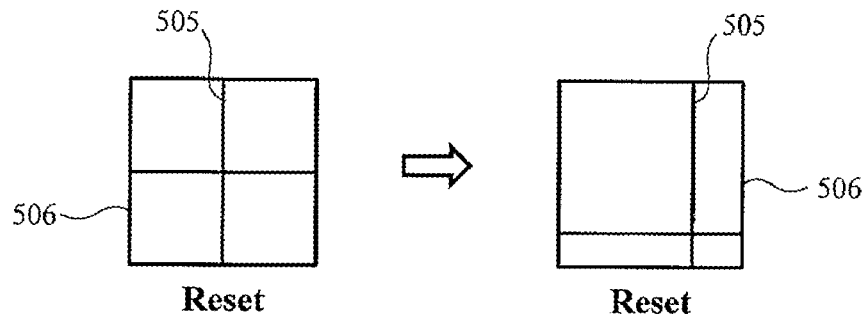
[Fig. 12]
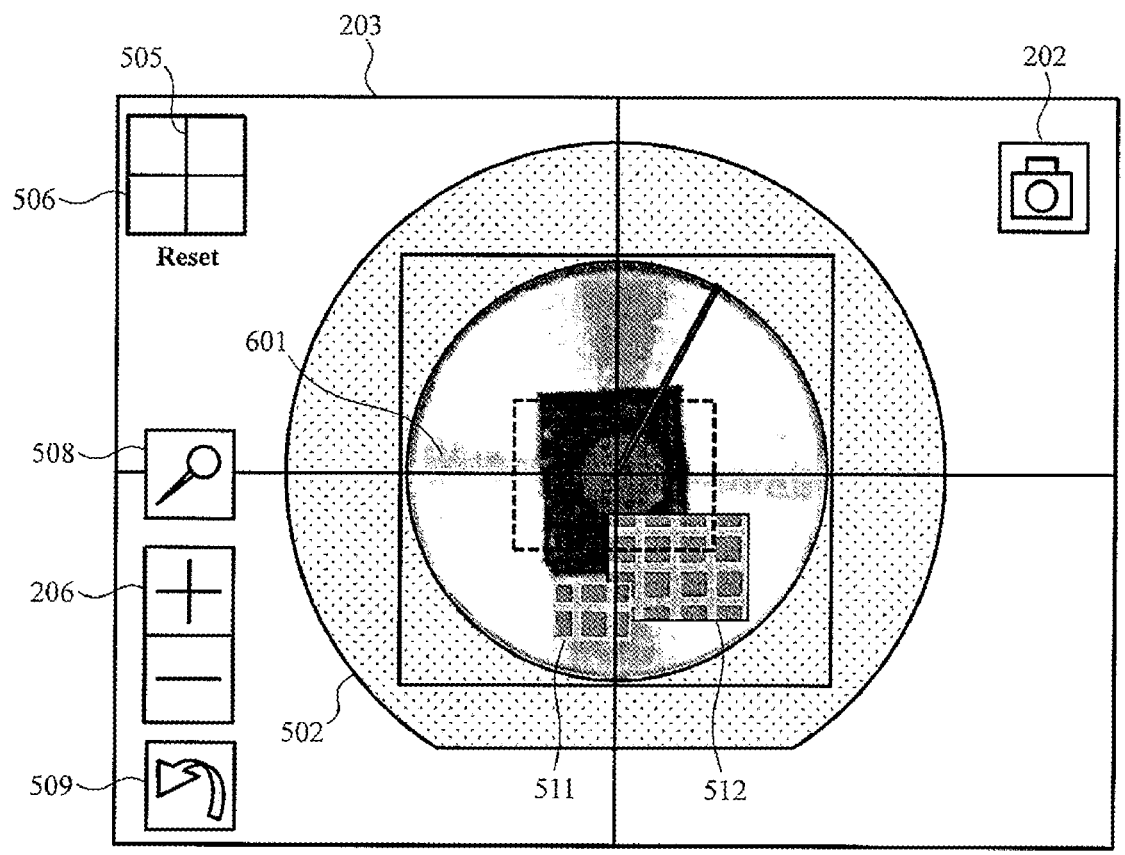

[Fig. 13]
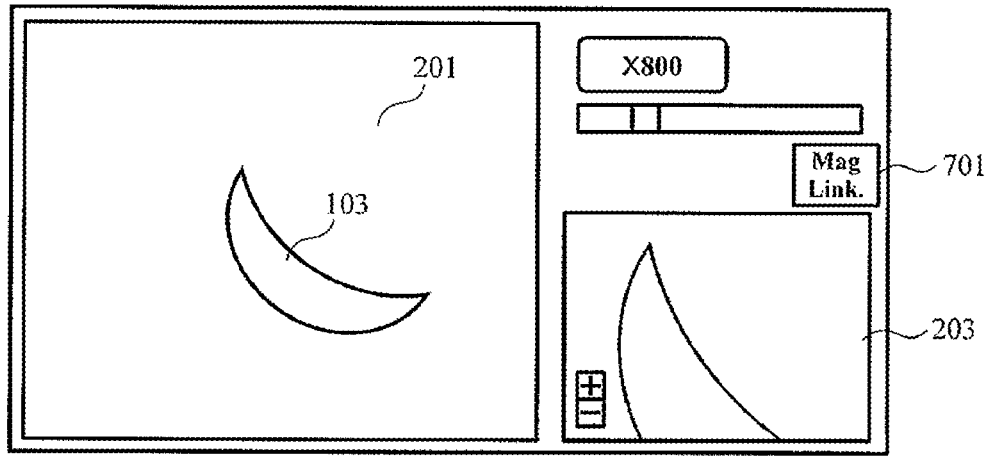
[Fig. 14]
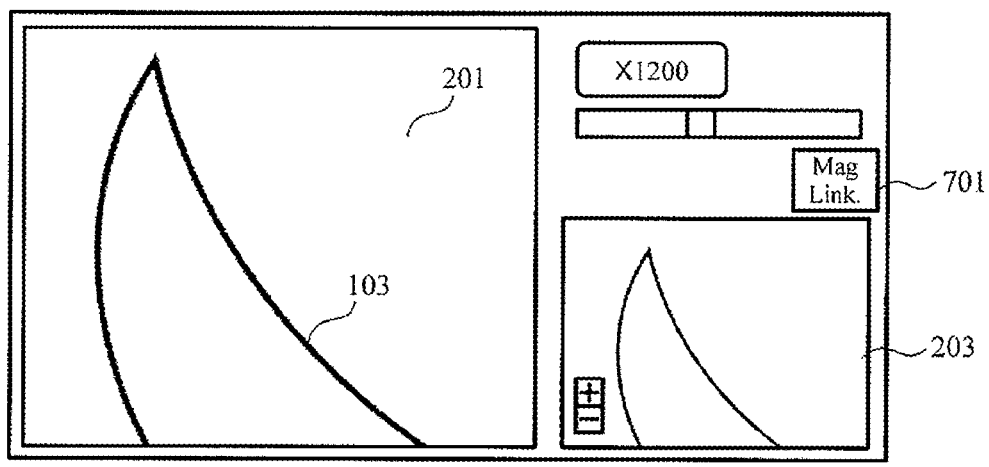
[Fig. 15]
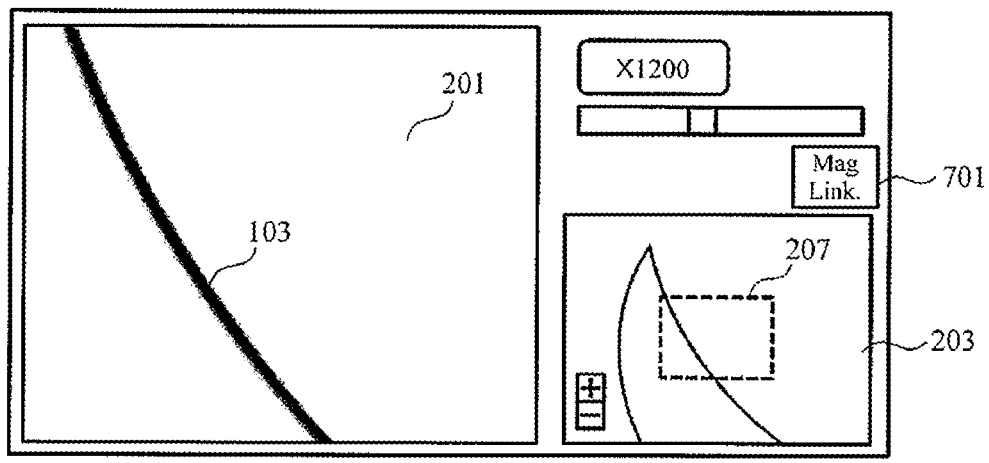

[Fig. 16]
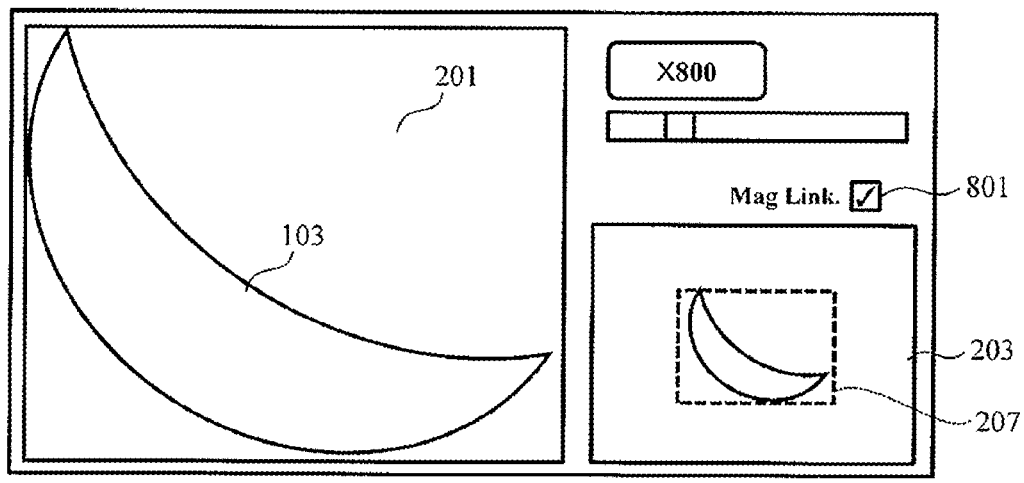
[Fig. 17]
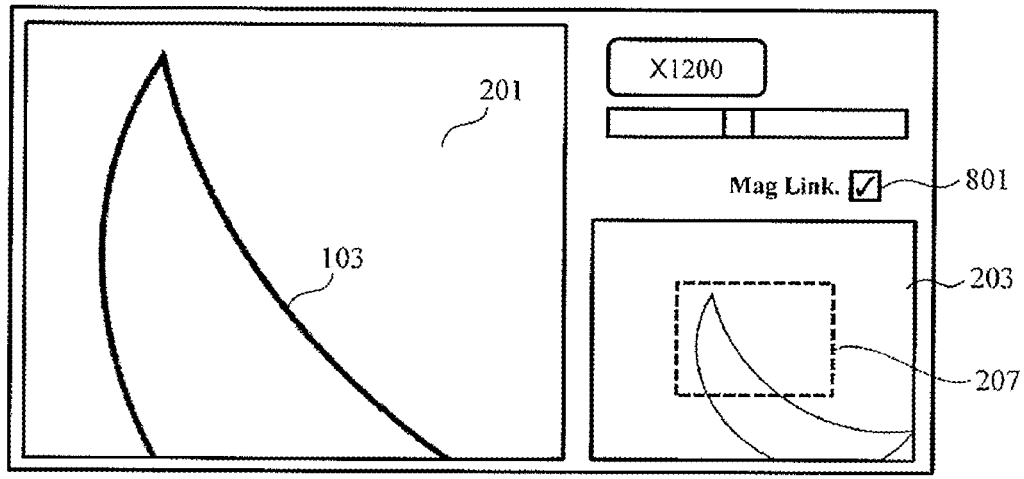

[Fig. 18]
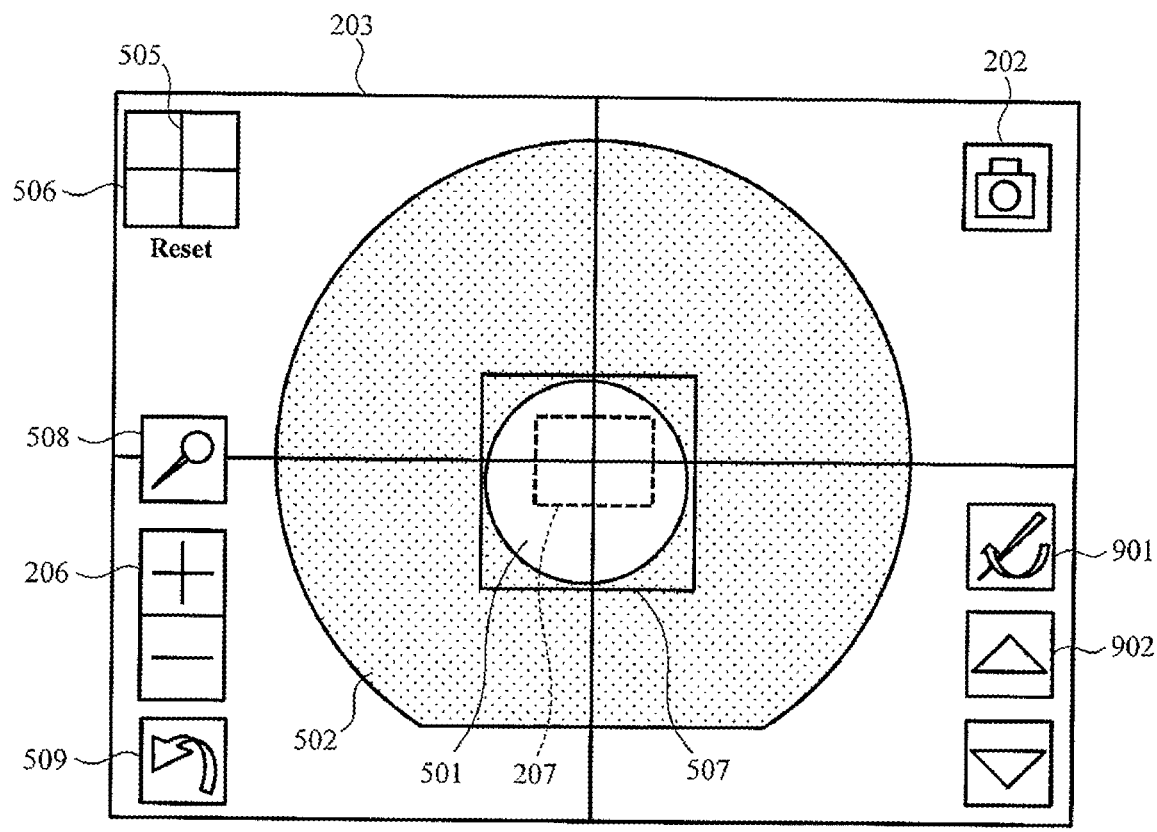

[Fig. 19]
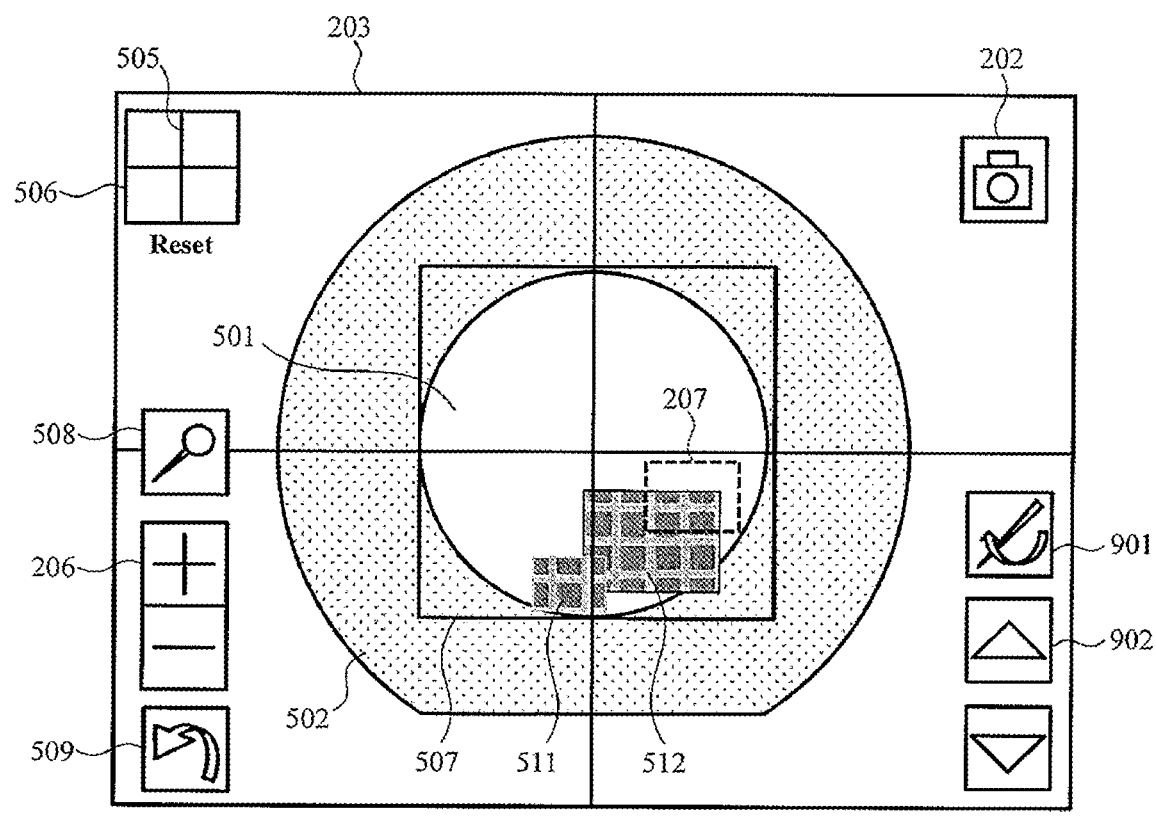

[Fig. 20]
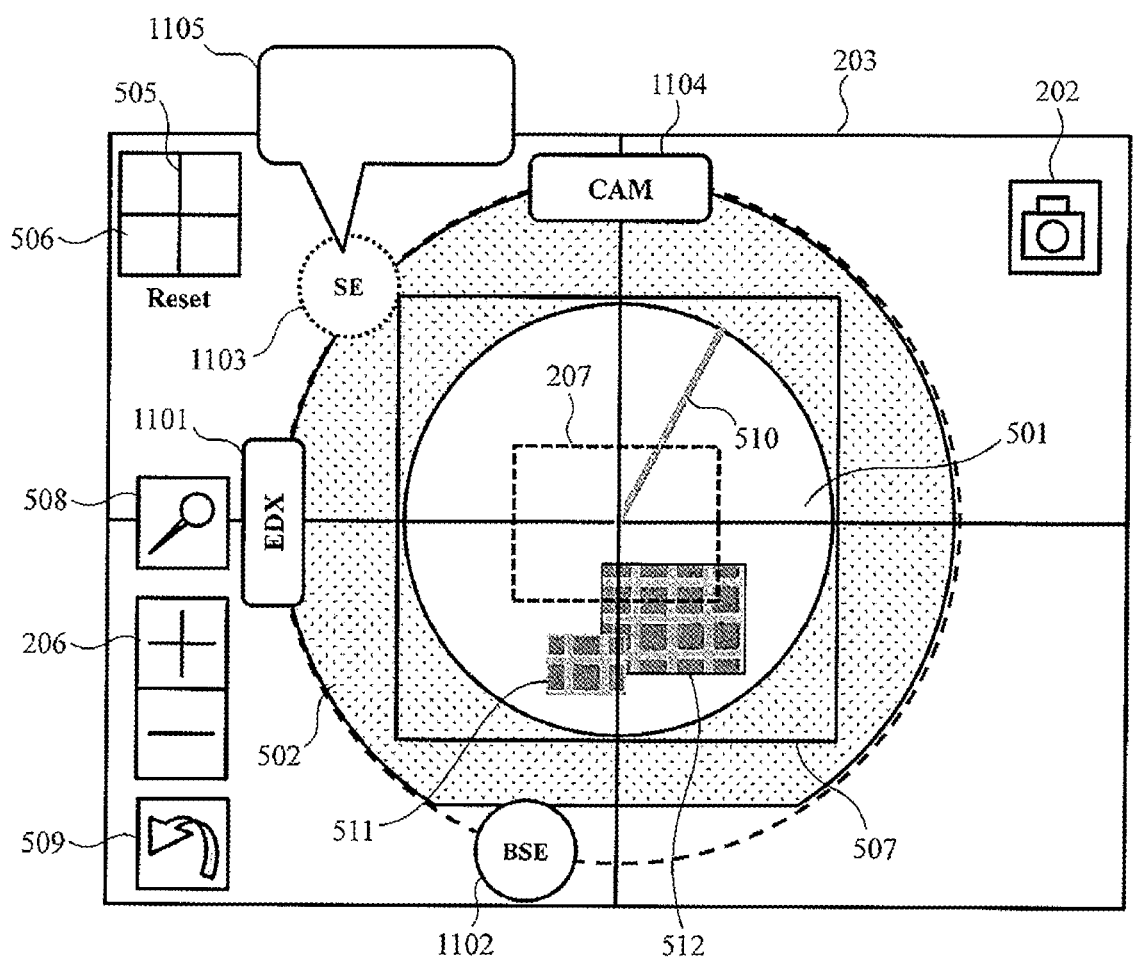

CHARGED PARTICLE BEAM APPARATUS, OBSERVATION METHOD USING CHARGED PARTICLE BEAM APPARATUS, AND PROGRAM

TECHNICAL FIELD

The present invention relates to an observation technology of a charged particle beam apparatus.

BACKGROUND ART

A charged particle beam apparatus is an apparatus that irradiates a sample with a charged particle beam and performs observation, and thus it is necessary to set an observation object in a vacuum in order to prevent charged particles from scattering. Therefore, there has been known an observation auxiliary function of displaying an image captured at lower magnification than observation magnification, in order to identify an observation position on a sample, in a case where it is not possible to recognize the observation sample with naked eyes, and providing the observation position on the captured image having a low magnification.

There are PTL 1 and PTL 2 as background art of this technical field. In PTL 1, description of "means for displaying an observation frame superimposed on an optical image of a sample, and the like" is provided. In addition, PTL 2 discloses that "it is possible to provide a scanning electron microscope that is capable of obtaining a very low-magnification image in a short time and with a small memory capacity and performing a search for a visual field by wide-field image observation, during the search for a visual field in a condition that it is not possible to observe the entire region of a sample even at the lowest magnification".

CITATION LIST

Patent Literature

PTL 1: JP-A-10-3875
PTL 2: JP-A-7-130319

SUMMARY OF INVENTION

Technical Problem

The inventors of this application have obtained the following findings, as a result of an intensive study on a method for identifying and setting an observation position of a sample by intuition and with high accuracy in a charged particle beam apparatus.

In the related art, in observation by using the charged particle beam apparatus, the following methods are used as means for identifying an observation position of a sample set in a sample chamber in a vacuum.

(1) Provide one image having a low magnification, and illustrate an observation position on the low-magnification image.

(2) Image a plurality of low-magnification images and illustrate observation positions by switching the low-magnification images depending on magnification.

(3) Capture images in a designated continuous region, generate a low-magnification image by connecting the images, and illustrate an observation position of a sample.

For example, the apparatus in PTL 1 provides an observation position on a sample by displaying a frame indicating a current observation position on one low-magnification optical image. The apparatus in PTL 2 acquires a plurality of images while capturing and stage moving are alternately performed and finally aligns the images based on coordinate, thereby generating one low-magnification image for a search for a visual field.

However, in a method for providing the low-magnification image or the observation position on the connected low-magnification image, it is difficult to identify the observation position in a case where a magnification of a visual field displayed on a screen of the optical image or the connected image significantly differs from a magnification of an observation field in which observation is currently performed. In addition, also in a method for providing an observation position by switching a plurality of low-magnification images, an image, on which the observation position is to be displayed, is not suitable for the magnification at which the image is currently observed in some cases.

Hence, the present invention provides a technology in which it is possible to provide an observation position even when a magnification at which current observation is performed (a magnification of an observation image) significantly differs from a magnification of an image on which the observation position is displayed.

Solution to Problem

For example, in order to solve such a problem described above, configurations described in claims are adopted. This application includes a plurality of means which solve the problem described above and, as an example thereof, there is provided a charged particle beam apparatus including: an optical system that irradiates a sample mounted on a sample stage with a charged particle beam; at least one detector that detects a signal which is generated from the sample; an imaging device that acquires an observation image from the detected signal; a mechanism for changing observation positions in the sample which has at least one of a stage that moves the sample stage and a deflector that changes an irradiation position of the charged particle beam; a display unit that displays an operation screen provided with an observation image displaying portion that displays the observation image and an observation position displaying portion that displays an observation position of the observation image; and a controller that controls display processing of the operation screen. The controller causes a plurality of observation position displaying images at different magnifications to be superimposed and displayed on the observation position displaying portion, based on magnifications and coordinates at which the observation images are acquired.

In addition, according to another example, there is provided an observation method performed by using a charged particle beam apparatus, the method including: a step of irradiating a sample mounted on a sample stage with a charged particle beam by an optical system; a step of detecting a signal that is generated from the sample by at least one detector; a step of acquiring an observation image from the detected signal by an imaging device; a step of displaying, by a controller on a display unit, an operation screen provided with an observation image displaying portion that displays the observation image and an observation position displaying portion that displays an observation position of the observation image; and a step of superimposing and displaying a plurality of observation position displaying images at different magnifications on the observation position displaying portion, by the controller based on magnifications and coordinates at which the observation images are acquired.

In addition, according to still another example, there is provided a program that causes an information processing device including a calculation unit, a storage unit, and a display unit to execute a process of displaying an observation image obtained by a charged particle beam apparatus, the program causing the calculation unit to execute a display process of displaying, on the display unit, an operation screen provided with an observation image displaying portion that displays the observation image and an observation position displaying portion that displays an observation position of the observation image, and a display process of superimposing and displaying a plurality of observation position displaying images at different magnifications on the observation position displaying portion, based on magnifications and coordinates at which the observation images are acquired.

Advantageous Effects of Invention

According to the present invention, it is possible to provide an observation position even when a magnification at which current observation is performed (a magnification of an observation image) significantly differs from a magnification of an image on which the observation position is displayed. Additional features related to the present invention are clarified in the description of the present specification and accompanying features. In addition, problems, configurations, and effects other than those in above description are clarified in the following description of examples.

BRIEF DESCRIPTION OF DRAWINGS

FIG. 1 illustrates an example of a schematic diagram of a charged particle beam apparatus according to the present invention.

FIG. 2 illustrates an example of a configuration of displaying an observation position on an operation screen of the charged particle beam apparatus according to the present invention.

FIG. 3 illustrates an example of the configuration of displaying the observation position on the operation screen of the charged particle beam apparatus according to the present invention.

FIG. 4 illustrates an example of the configuration of displaying the observation position on the operation screen of the charged particle beam apparatus according to the present invention.

FIG. 5 illustrates an example of the configuration of displaying the observation position by using a plurality of images on the operation screen of the charged particle beam apparatus according to the present invention.

FIG. 6 illustrates an example of the configuration of displaying the observation position by using the plurality of images on the operation screen of the charged particle beam apparatus according to the present invention.

FIG. 7 illustrates the operation screen before a rotating operation by a stage or an optical system, in the operation screen of the charged particle beam apparatus according to the present invention.

FIG. 8 illustrates the operation screen after the stage rotates the orientation of the sample, in the operation screen of the charged particle beam apparatus according to the present invention.

FIG. 9 illustrates the operation screen after the rotating operation by the optical system, in the operation screen of the charged particle beam apparatus according to the present invention.

FIG. 10 illustrates an example of a basic configuration of an observation position displaying portion according to the present invention.

FIG. 11 is a diagram illustrating an operation of a deflection degree displaying indicator of the observation position displaying portion according to the present invention.

FIG. 12 illustrates an example of a configuration of displaying a plurality of images obtained by different imaging systems in the observation position displaying portion according to the present invention.

FIG. 13 illustrates a first example of controlling a magnification of an observation image and a magnification of the observation position displaying portion in conjunction with each other.

FIG. 14 illustrates the first example of controlling the magnification of the observation image and the magnification of the observation position displaying portion in conjunction with each other.

FIG. 15 illustrates the first example of controlling the magnification of the observation image and the magnification of the observation position displaying portion in conjunction with each other.

FIG. 16 illustrates a second example of controlling the magnification of the observation image and the magnification of the observation position displaying portion in conjunction with each other.

FIG. 17 illustrates the second example of controlling the magnification of the observation image and the magnification of the observation position displaying portion in conjunction with each other.

FIG. 18 is a view illustrating another configuration of the observation position displaying portion in the operation screen according to the present invention.

FIG. 19 illustrates another example of an indicator of the observation position in the observation position displaying portion according to the present invention.

FIG. 20 illustrates an example of displaying a positional relationship between detectors in a sample chamber on the observation position displaying portion according to the present invention.

DESCRIPTION OF EMBODIMENTS

Hereinafter, examples of the present invention will be described with reference to the accommodating figures. The accompanying figures illustrate specific examples in accordance with a principle of the present invention; however, the examples are described for easy understanding of the present invention and are never used to limit the present invention to the description.

A charged particle beam apparatus accelerates particles which are charged (charged particles), such as an electron or a cation, with an electric field and irradiates a sample. The charged particle beam apparatus performs observation, analysis, processing, or the like of a sample by using an interaction between a sample and charged particles. Examples to be described below can be applied to an electron microscope, an electron beam drawing apparatus, an ion processing apparatus, an ion microscope, or various charged particle beam apparatuses such as observation·inspection apparatus obtained by applying the apparatuses described above.

First Example

FIG. 1 is an example of a charged particle beam apparatus. For example, the charged particle beam apparatus includes a sample chamber 101 that maintains a vacuum state such that a charged particle beam is not scattered, an optical system 102 that finally converges charged particle beams to a sample 103, a detector 106 that detects a signal which is obtained from the sample 103, and an imaging device 110 that converts the signal detected by the detector 106 into an image.

The optical system 102 includes a charged particle source 141, a deflector 108, an objective lens 142, and the like. The optical system 102 may include another lens and an electrode, in addition to the constituent elements described above, some of the elements may be different, and a configuration of the optical system 102 is not limited thereto.

The imaging device 110 includes a memory 151 that stores a signal detected in the detector 106. The imaging device 110 converts the signal detected in the detector 106 into an image. The image acquired by the imaging device 110 is transmitted to control and calculation unit 111 and is displayed on a display unit 112.

The control and calculation unit 111 is a controller that controls various constituent elements of the charged particle beam apparatus in an observation condition input by a user and controls a display of observation results. The control and calculation unit 111 is configured of an information processing device such as a computer. For example, the control and calculation unit 111 includes a CPU (also referred to as a processor) 113, a main storage device 114 as a memory, a secondary storage device 115 as a HDD, an input unit 116 as a keyboard and a mouse, the display unit 112 as a display, and a communication unit (not illustrated) that communicates with constituent elements of the charged particle beam apparatus.

The control and calculation unit 111 is capable of displaying, on the display unit 112, an image from the imaging device 110 and information of an observation position from a stage control device 120 into a type that is viewed by a user and storing the image and the information in the storage devices 114 and 115. In order to perform such a process, the control and calculation unit 111 includes a display processing unit 117 that performs a process of displaying an operation screen on the display unit 112 and a setting processing unit 118 that sets various observation conditions.

The process that is executed by the control and calculation unit 111 can be executed by software. For example, various programs stored in the secondary storage device 115 is evolved in the main storage device 114. Here, programs corresponding to the display processing unit 117 and the setting processing unit 118 are evolved. In addition, an image input from the imaging device 110 is temporarily stored in the main storage device 114. The CPU 113 executes a program loaded in the main storage device 114.

The charged particle beam apparatus includes a sample stage 104 on which the sample 103 is mounted, a stage 105 on which the sample stage 104 is disposed, and a deflector 108 that changes an irradiation position of the charged particle beam so as to change the observation position. The charged particle beam apparatus may include at least one of the stage 105 and the deflector 108, as a mechanism that changes the observation position.

The stage 105 is a mechanism that moves the sample stage 104 so as to change the observation position. The stage 105 is controlled by the stage control device 120. The stage control device 120 includes a controller 121, a drive unit 122, and a coordinate storage unit 123. The controller 121 controls an operation of the entire stage control device 120. The drive unit 122 generates a drive signal and drives the stage 105. The coordinate storage unit 123 stores a stage coordinate. The controller 121 acquires stage coordinate information from the coordinate storage unit 123 and transmits the stage coordinate image to the control and calculation unit 111. In this manner, the control and calculation unit 111 is capable of finding the coordinate position of the captured image. The stage coordinate may be stored in the stage control device 120 or may be stored in the control and calculation unit 111.

The deflector 108 is controlled by the deflection control device 130. The deflection control device 130 includes a controller 131, a drive unit 132, and a coordinate storage unit 133. The controller 131 controls an operation of the entire deflection control device 130. The drive unit 132 generates a drive signal and drives the deflector 108. The coordinate storage unit 133 stores a deflection degree. The controller 131 acquires the deflection degree information from the coordinate storage unit 133 and transmits the information to the control and calculation unit 111. In this manner, the control and calculation unit 111 is capable of finding whether any coordinate on the sample 103 is irradiated with the charged particle beam. The deflection degree may be stored in the deflection control device 130 or may be stored in the control and calculation unit 111. According to the configuration, it is possible to identify the acquired image and observation position.

FIGS. 2 and 3 illustrate an example of the operation screen that is displayed on the display unit 112. The display processing unit 117 of the control and calculation unit 111 displays the operation screen on the display unit 112. Hereinafter, an image that is obtained by irradiating the sample 103 with the charged particle beam is referred to as an "observation image", and an image for identifying the observation position in the sample 103 is referred to as an "observation position displaying image". In this example, the operation screen includes an observation image displaying portion 201, an observation image importing portion 202, an observation position displaying portion 203, an observation magnification setting portion 205, and an observation position displaying portion-magnification setting portion 206.

The observation image displaying portion 201 is a region for displaying the observation image. The observation image that is obtained by irradiating the sample 103 with the charged particle beam is input to the control and calculation unit 111 via the imaging device 110. The display processing unit 117 displays the observation image on the observation image displaying portion 201. In an example in FIG. 2, an image displayed on the observation image displaying portion 201 is a low-magnification image obtained by capturing the entire sample 103.

The observation position displaying portion 203 is a region for displaying the observation position displaying image. The observation image importing portion 202 is an interface for importing the observation position displaying image on the observation position displaying portion 203. Here, in order to acquire the observation position displaying image, a user clicks the observation image importing portion 202 by using the input unit 116. When receiving the input, the display processing unit 117 acquires an image that is displayed on the observation image displaying portion 201, and the image is displayed on the observation position displaying portion 203. Here, as illustrated in FIG. 3, the observation position displaying image that is displayed on the observation position displaying portion 203 is a first image 204 having a low magnification.

The observation magnification setting portion 205 is a slide bar by which a magnification of the observation image is settable. The observation magnification setting portion 205 can increase or decrease the magnification of the observation image. FIG. 3 illustrates an example in which the user operates the observation magnification setting portion 205 by using the input unit 116 after the first image 204 is displayed on the observation position displaying portion 203, and the magnification of the observation image is increased.

The display processing unit 117 displays an observation position indicator 207 on the observation position displaying portion 203 in order to assist identification of the observation position. In the example in FIG. 3, a position of the image that is currently displayed on the observation image displaying portion 201 is displayed on the first image 204 by the observation position indicator 207. In this example, the observation position indicator 207 is a frame that indicates the same region as an observation field.

The observation position displaying portion-magnification setting portion 206 is an interface for adjusting the magnification of the observation position displaying portion 203 and can be used to zoom in to and out from the observation position displaying image. The observation position displaying portion-magnification setting portion 206 can zoom in to or out from the first image 204. In the related art, in a case where the magnification of the observation image is increased, the indicator of the observation position is reduced on the image having the low magnification, and thus it is difficult to find an observation field range and the observation position. By comparison, in this example, the observation magnification setting portion 205 can increase the magnification of the observation image, a button (plus button) of the observation position displaying portion-magnification setting portion 206 is pressed such that it is possible to zoom in to the observation position displaying image. In association with the operation, the image that is displayed on the observation position displaying portion 203 zooms in and the observation position indicator 207 in a region of the observation field is increased. In this manner, the user can find the observation field range and observation position with accuracy.

In this example, the observation position indicator 207 may be a frame that indicates the same region as the observation field or may be a cross cursor. The observation position indicator 207 may be capable of identifying an observation position or may have a different shape. In addition, here, as an example, the observation position indicator 207 is displayed on the observation position displaying portion 203; however, the observation position indicator may not be displayed.

In the example, the display processing unit 117 displays the first image 204 on the observation position displaying portion 203 such that the central position of the observation image displaying portion 201 is coincident with the central position of the observation position displaying portion 203. Hence, when the stage 105 or the deflector 108 for changing the observation position is controlled and the observation position is changed, the display processing unit 117 moves the first image 204 in the observation position displaying portion 203 in conjunction with change in observation position. In this example, the display processing unit 117 always displays the current observation position (observation position indicator 207) at the central position of observation position displaying portion 203. As an another example, the first image 204 is not moved, and the observation position indicator 207 may be moved in the observation position displaying portion 203 in conjunction with the control of the stage 105 or the deflector 108.

In addition, in the example, a predetermined position on the first image 204 of the observation position displaying portion 203 is clicked, and thereby the first image can move to the observation position corresponding to the clicked position. When receiving information of a click to the observation position displaying portion 203, the setting processing unit 118 transmits a control signal to the stage control device 120 or the deflection control device 130. In this manner, the first image moves to the observation position corresponding to the clicked position. The display processing unit 117 displays the observation image of the observation position obtained after the movement on the observation image displaying portion 201 and the first image 204 is moved such that the clicked position is coincident with the center of the observation position displaying portion 203. FIG. 4 illustrates an operation screen obtained after the observation position is designated. The user clicks the position 208 on the operation screen in FIG. 3. The setting processing unit 118 transmits the control signal to the stage control device 120 or a deflection control device 130 such that the position 208 is coincident with the observation position. The display processing unit 117 displays the observation image of the observation position on the observation image displaying portion 201 and moves the first image 204 such that the clicked position 208 is coincident with the center of the observation position displaying portion 203.

It is possible to use various designation methods as the designation method described above as long as it is possible to designate the observation position. The designation method of the observation position may be a method by the click or may be a method of moving the first image 204 through drag and drop with respect to the observation position indicator 207. In addition, in a case of using a touch panel, the designation method described above may be a touch operation, a drag operation, or the like.

In addition, the designation of the observation position may be performed on the observation image displaying portion 201. For example, any position on the observation image displaying portion 201 is clicked. The setting processing unit 118 transmits the control signal to the stage control device 120 or the deflection control device 130 such that the clicked position is coincident with the observation position (that is, the clicked position is coincident with the central position of the observation image displaying portion 201). The display processing unit 117 displays the observation image of the observation position on the observation image displaying portion 201 and moves the first image 204 such that the clicked position is coincident with the center of the observation position displaying portion 203.

FIGS. 5 and 6 illustrate an example in which a plurality of images are imported on the observation position displaying portion 203. In the example, it is possible to import the plurality of images having different magnifications on the observation position displaying portion 203. For example, in the state in FIG. 3, a user clicks the observation image importing portion 202 by using the input unit 116. At this time, the display processing unit 117 displays a second image 301 having an observation magnification higher than that of the first image 204 on the observation position displaying portion 203. The second image 301 has a visual field narrower than that of the first image 204; however, when the images are compared in the same field region, the second image 301 has higher resolution than the first image 204 and becomes an image having much information. As described above, a high-magnification image is obtained in a region in which the user is interested, and it is possible to import the image as the observation position displaying image. Hence, it is possible to generate an observation position displaying map having a larger amount of information in the region in which the user is interested.

The first image 204 and the second image 301 imported by the observation image importing portion 202 are accumulated in the main storage device 114 or a secondary storage device 115 in a form associated with the coordinate positions of the images. The display processing unit 117 superimposes and displays a plurality of observation position displaying images (the first image 204 and the second image 301) having different magnifications on the observation position displaying portion 203, based on the magnification and the coordinate at which the observation images (here, the first image 204 and the second image 301) are acquired.

FIG. 5 illustrates an example in which the user operates the observation magnification setting portion 205 by using the input unit 116 after the second image 301 is imported on the observation position displaying portion 203, and the magnification of the observation image is increased. In the example in FIG. 5, a position of the observation image that is currently displayed on the observation image displaying portion 201 is displayed on the second image 301 by the observation position indicator 207.

FIG. 6 illustrate an example in which a button (minus button) of the observation position displaying portion-magnification setting portion 206 is pressed and the observation position displaying image (the first image 204 and the second image 301) zoom out. The first image 204 and the second image 301 are displayed on a position corresponding to the coordinate position, based on the coordinate position during the imaging. In the example in FIG. 6, the first image 204 and the second image 301 are superimposed and displayed on the observation position displaying portion 203. Since the second image 301 is the high-magnification image, a display size of the second image 301 on the observation position displaying portion 203 is smaller than a display size of the first image 204. Here, the display processing unit 117 superimposes and displays the second image 301 having the adjusted size at a position (coordinate position) corresponding to the first image 204. In FIGS. 5 and 6, an example in which two images having different magnifications during the observation are imported on the observation position displaying portion 203; however, it is needless to say that three or more images may be imported on the observation position displaying portion 203.

According to the configuration described above, while the user appropriately changes the magnification and the observation position of the observation image, it is possible to import the plurality of images having different magnifications as the observation position displaying image on the observation position displaying portion 203. It is possible to identify the observation position on the image (first image 204) having the low magnification in a case where the magnification of the observation image is low, whereas it is possible to identify the observation position on the image (second image 301) having the high magnification in a case where the magnification of the observation image is high.

In addition, according to the configuration described above, the user can import many images having the high resolution in a region in the vicinity of a structure as an observation object, and thus much information is obtained. On the other hand, in a region in which only an external appearance of the sample 103 is seen, the image having low resolution may be imported. Hence, while the user appropriately changes the magnification and the observation position of the observation image according to an observation object of the user, it is possible to generate a map for identifying the observation position. In addition, since the user may import an image having the high resolution in only a necessary region, it is possible to reduce an amount of use of the image memory. In addition, since an amount of irradiation to the sample 103 with the charged particle beam, it is possible to reduce damage to the sample 103.

FIGS. 7 to 9 illustrate an example in a case of using a rotation operation by the stage and the optical system. The stage 105 has two axes (an X axis and a Y axis) through which movement in a plane is performed to be orthogonal to the charged particle beam and an axis (a Z axis) that moves in a direction (vertical direction) in which the sample 103 is parallel with the charged particle beam. In addition to this, the stage 105 has an axis (T axis) of inclination of the sample 103 with an axis orthogonal to the charged particle beam as the center and an axis (R axis) of rotation of the sample 103 around an axis parallel to the charged particle beam. Here, rotation on the R-axial stage in the stage 105 is described.

When the R-axis stage is rotated such that an orientation of the sample 103 is rotated, the observation image that is displayed on the observation image displaying portion 201 is rotated. In conjunction with the rotation, the display processing unit 117 rotates the first image 204 and the second image 301 about a coordinate (reference sign 401) of a rotation axis of the R-axis stage on the observation position displaying portion 203. FIG. 7 illustrates an operation screen obtained before the rotation operation by the stage or the optical system. FIG. 8 illustrates an operation screen obtained when the rotation operation is performed by the R-axis stage.

In addition, the optical system 102 includes a mechanism that changes a scanning direction of the charged particle beam. Hence, it is possible to change the scanning direction of the charged particle beam and to rotate and display the observation information by the optical system 102. FIG. 9 illustrates the operation screen obtained when the rotation operation is performed by the deflector 108 of the optical system 102. In a case where the optical system 102 rotates the observation image, the display processing unit 117 rotates the first image 204 and the second image 301 about the center (reference sign 402) of the observation position displaying portion 203 in conjunction with the rotation of the observation image.

As described above, in a case where the display processing unit 117 moves the observation position by the stage 105 or the deflector 108, the display processing unit 117 moves the first image 204 and the second image 301 in conjunction with the movement of the observation position.

According to the configuration described above, an orientation of the images (the first image 204 and the second image 301) of the observation position displaying portion 203 is always coincident with that of the observation image displaying portion 201. Hence, the user can find the orientation of the sample 103 with intuition, and the operability improves.

FIG. 10 illustrates an example of the observation position displaying portion 203. In FIG. 10, the same reference signs are assigned to the same constituent elements as those in FIGS. 2 and 3, and the description thereof is omitted.

In the configuration, a positional relationship between the sample 103 and the sample stage 104 is unclear. In addition, when the observation position displaying image is imported on the observation position displaying portion 203, the position of the sample 103 in the sample chamber 101 is unclear. Hence, a sample stage simulating FIG. 501 and the sample chamber cross-section simulating FIG. 502 are displayed on the observation position displaying portion 203. In this manner, before the observation position displaying image is imported on the observation position displaying portion 203, it is possible to substantially find the position of the sample 103 in the sample chamber 101 and a positional relationship between the sample stage 104 and the observation sample.

In addition, the display processing unit 117 changes a size of the sample stage simulating FIG. 501 by linking with a size of the sample stage 104 and displays the figure on the observation position displaying portion 203. Hence, it is possible to more intuitively find a positional relationship between the sample stage and the sample 103 in the sample chamber 101.

In the example, when the stage control device 120 moves the stage 105, the display processing unit 117 moves the sample stage simulating FIG. 501 on the observation position displaying portion 203 in conjunction with the movement of the stage 105. In this manner, the user can find the positional relationship obtained during the observation in real time.

In addition, any position of the observation position displaying portion 203 is clicked, and thereby the stage 105 may be moved to the clicked position. When receiving information of a click to the observation position displaying portion 203, the setting processing unit 118 transmits a control signal to the stage control device 120. The sample stage simulating FIG. 501 of the observation position displaying portion 203 may be moved through drag and drop, and thereby the stage 105 may be moved. The setting processing unit 118 transmits the control signal to the stage control device 120 such that the position of the sample stage simulating FIG. 501 after the drag and drop is coincident with the position of the stage 105. According to the configuration described above, it is possible to change the observation field by the click or the drag and drop on the observation position displaying portion 203. In particular, in a case where many images and various setting portions are displayed on the observation position displaying portion 203, it is advantageous to be able to designate the observation position by the drag and drop.

In addition, the display processing unit 117 displays, on the observation position displaying portion 203, a center indicator 503 indicating a position that is currently observed. The user can identify the accurate observation position with the center indicator 503.

The display processing unit 117 controls to decrease a size of the observation position indicator 207, when the magnification of the observation image increases. In addition, the display processing unit 117 controls to increase the size of the observation position indicator 207, when the magnification of the observation image decreases.

The display processing unit 117 controls to increase the size of the observation position indicator 207, when the magnification of the observation position displaying portion 203 increases by the observation position displaying portion-magnification setting portion 206. In addition, the display processing unit 117 controls to decrease the size of the observation position indicator 207, when the magnification of the observation position displaying portion 203 decreases by the observation position displaying portion-magnification setting portion 206. According to the control described above, it is possible to find a visual field range of the current observation position with accuracy.

When the observation position displaying image is imported on the observation position displaying portion 203 by the observation image importing portion 202, the display processing unit 117 adjusts the magnification of the observation position displaying portion 203 such that the imported observation position displaying image is displayed on the entire region of the observation position displaying portion 203. In this manner, it is possible to adjust current observation magnification and the magnification of the observation position displaying portion 203 immediately after the image imported. This function makes it possible to find the accurate observation position without manipulating the magnification of the observation position displaying portion 203. In addition, the adjustment of the magnification of the observation position displaying portion 203 enables the user to immediately find which position on the sample 103 is observed.

In addition, in a case where the magnification of the observation position displaying portion 203 decreases, and an image is acquired in a condition of the high observation magnification, the image is displayed to have a small size in the observation position displaying portion 203, and thus visibility deteriorates. Hence, when the magnification of the observation position displaying portion 203 decreases, the display processing unit 117 may display the image in a rectangular frame having the same size as that of the image. In a case where only the position of the imported image needs to be found, a mark is not limited to the frame, and a mark such as a point or a circle may be displayed at the position of the image.

In addition, when the magnification of the observation position displaying portion 203 decreases, the display processing unit 117 may set the image to non-display in a case where the observation position displaying image is smaller than a predetermined size. For example, a first image 511 and a second image 512 are displayed on the observation position displaying portion 203. Here, the first image 511 is a high-magnification image obtained when the observation is performed at high magnification, and the second image 512 is a low-magnification image obtained when the observation is performed at magnification lower than that of the first image 511. When the magnification of the observation position displaying portion 203 decreases, the display processing unit 117 sets the first image 511 to non-display in a case where the first image 511 is smaller than the predetermined size. On the other hand, when the magnification of the observation position displaying portion 203 increases, the display processing unit 117 redisplays the first image 511.

The observation image importing portion 202 may be a button as illustrated in FIG. 10 or may be realized in another form. For example, the observation image importing portion 202 may be realized as a mouse gesture or another interface such as a gesture performed by a function of a touch monitor. In addition, as another example, the display processing unit 117 may import the observation image as the observation position displaying image on the observation position displaying portion 203, in conjunction with an operation of capturing the observation image or stopping the display of the observation image. In addition, as still another example, the observation image may be automatically imported as the observation position displaying image on the observation position displaying portion 203 in an observation condition designated by a user in advance.

The display processing unit 117 may manage history of importation performed by the observation image importing portion 202. For example, the display processing unit 117 may manage history of coordinates at which the observation position displaying image is imported and may display the history on the operation screen. The user can designate a coordinate at which the observation position displaying image was imported in the past from the history. When the coordinate is designated, the setting processing unit 118 controls to move the observation position to the designated coordinate. In this manner, it is possible to cause the position at which the observation position displaying image is imported, to reappear, and it is possible to easily reimage an observation position displaying image.

The display processing unit 117 performs calculation such that the first image 511 has the same magnification as that of the second image 512 and displays the first image 511 and the second image 512 obtained after the calculation on the observation position displaying portion 203. Hence, as illustrated in FIG. 10, since the first image 511 is an image acquired at the magnification higher than that of the second image 512, a display size of the first image 511 is smaller than a display size of the second image 512 on the observation position displaying portion 203.

As described above, the observation image importing portion 202 has a function of storing an observation image at any position as the observation position displaying image; however, the observation image importing portion is not limited thereto. The control and calculation unit 111 may repeat the stage control or the image storage such that observation images of the entire region of the sample stage 104 are acquired and, then, may acquire the observation position displaying image. In the example in FIG. 10, the observation position displaying portion 203 includes a continuous image importing portion 504. The user clicks the continuous image importing portion 504 by using the input unit 116. When the control and calculation unit 111 receives the input, the setting processing unit 118 controls the stage 105 or the deflector 108 such that the entire region of the sample stage 104 is imaged. The display processing unit 117 arranges a plurality of captured images on the observation position displaying portion 203 depending on coordinates of positions of the images. In this manner, it is possible to automatically acquire a wide region image having the low magnification. The user can designate a region in which the user is interested while watching the wide region image, import a high magnification image of the region on the observation position displaying portion 203, and generate a map on which the high magnification image is superimposed on the low magnification wide region image. The continuous image importation may be continuously performed at preset magnification so as to import the images, and the images of the entire region of the sample captured at the magnification, at which the observation is currently performed, may be imported.

In addition, in a case where the observation image is positioned based on only the stage coordinate, and the charged particle beam is deflected such that the visual field is moved, a stage coordinate position and the observation position on the sample 103 are likely to be shifted from each other. In order to solve such a problem, in the example in FIG. 10, the observation position displaying portion 203 includes a deflection degree displaying indicator 505 and a deflection cancelling function 506.

In a case where visual field movement is performed by deflecting the charged particle beam by the deflector 108, the display processing unit 117 moves the vertical axis and the horizontal axis of the cross-shaped deflection degree displaying indicator 505 so as to correspond to the visual field movement due to the deflection. FIG. 11 is a diagram illustrating an operation of the deflection degree displaying indicator 505. The display processing unit 117 moves the vertical axis and the horizontal axis of the deflection degree displaying indicator 505 depending on a deflection degree. In this manner, it is possible to show the user how much the stage position and the observation position are shifted from each other during the observation. The deflection degree displaying indicator 505 does not need to have the cross shape and may have another shape of a circle or a point. The deflection degree displaying indicator 505 may have any shape as long as a direction and a size from a reference position can be known.

In the example in FIG. 10, the deflection cancelling function 506 functions both as a frame indicating the deflection degree displaying indicator 505 and as a button for canceling the deflection of the charged particle beam. In a case where the user does not want the shift between the stage position and the observation position due to the deflection, the user clicks the deflection cancelling function 506 by using the input unit 116. When the setting processing unit 118 receives the input, the setting processing unit transmits a control signal to the deflection control device 130 such that the deflection is canceled. In this manner, the deflection degree is eliminated, the stage coordinate position is coincident with the observation position, and thereby it is possible to reduce a positional shift of the imported image.

In the example, the observation position displaying image is disposed on the observation position displaying portion 203 based on only the stage coordinate; however, this is not limited thereto. The control and calculation unit 111 may import the observation position displaying image on the observation position displaying portion 203 in a coordinate system obtained in consideration of the deflection degree. In a case of such a configuration, a function related to the deflection described above may also be omitted.

In addition, the observation position displaying portion 203 includes a movable range frame 507. The movable range frame 507 represents a movable limit of the stage 105 in the example. In a case where an outer side of a movable range of the stage is designated as a moving destination, a method of displaying a message showing that the stage is present out of the moving range is well known. In the example in FIG. 10, when the drag and drop of the sample stage simulating FIG. 501 for moving the stage is performed, restriction is imposed such that the sample stage simulating FIG. 501 is not able to move to the outer side of the movable range frame 507. In other words, the display processing unit 117 performs control such that the sample stage simulating FIG. 501 is movable within the movable range frame 507. In this manner, an unnecessary operation or displaying an error message is omitted, and thus it is possible to reduce time and effort of the user. It is needless to say that the display processing unit 117 may display a warning message on the operation screen at a timing of dropping, without the restriction description.

As described above, it is possible to change the magnification of the observation position displaying portion 203 by using the observation position displaying portion-magnification setting portion 206. For example, in a case where the observation position is identified by further increasing the magnification, the observation position displaying portion-magnification setting portion 206 zooms in to the observation position displaying image. At this time, a display size of the observation position indicator 207 also increases. The change in magnification of the observation position displaying portion 203 may not be limited to performance of a configuration of the observation position displaying portion-magnification setting portion 206. The magnification change of the observation position displaying portion 203 may be performed via a mouse wheel, a mouse gesture, or another interface such as a gesture performed by a function of a touch monitor.

In the example in FIG. 10, it is possible to record the coordinate of the observation position. Therefore, the observation position displaying portion 203 includes a coordinate registering portion 508. The user clicks the coordinate registering portion 508 by using the input unit 116. When the display processing unit 117 receives the input, the display processing unit stores information in association with the observation image with the coordinate of the observation position to the main storage device 114 or the secondary storage device 115. Here, a registered coordinate is a coordinate of the center of the observation field. In addition, the display processing unit 117 may display a mark of a registration position on the observation position displaying portion 203. In this case, when the observation position is moved, the display processing unit 117 moves the observation position displaying image and the mark in a state in which the positional relationship therebetween is maintained. The setting of the observation image and the coordinate of the observation position may be recorded in association with a set identifier to the main storage device 114 or the secondary storage device 115. A window for designating the coordinate of the observation position may be displayed on the operation screen. In this case, when the user designates an identifier of the coordinate, the observation field is moved to an observation position corresponding to the identifier. As another example, when the mark of the observation position displaying portion 203 is clicked, the observation field may be moved to a coordinate position corresponding to the mark.

When the magnification of the observation position displaying portion 203 is set to the high magnification, the magnification of the observation position displaying portion 203 is set to the low magnification in some cases, in order to find which portion on the entire sample 103 is viewed. In this case, in order to decrease the magnification to the extent that the entire sample 103 is displayed on the observation position displaying portion 203, it is necessary to click the observation position displaying portion-magnification setting portion 206 several times. The user needs to spend time and effort for this operation. Therefore, in the example in FIG. 10, the observation position displaying portion 203 includes a magnification changing portion 509 for changing the magnification to a prescribed magnification. The user clicks the magnification changing portion 509 by using the input unit 116. When the display processing unit 117 receives the input, the display processing unit switches the magnification to the prescribed magnification designated by the user. For example, the magnification at which the entire region of the sample is displayed is set as the prescribed magnification in advance. In this manner, by clicking the magnification changing portion 509 only once, it is possible to immediately check which portion on the sample 103 is observed during the observation. Hence, the usability improves.

The observation position displaying portion 203 may have a function of setting the prescribed magnification of the magnification changing portion 509 while the user checks the observation position displaying portion 203. For example, a configuration may be employed such that the user can zooms in to or out from the observation position displaying portion 203 by using the observation position displaying portion-magnification setting portion 206 and can designate the magnification as the prescribed magnification of the magnification changing portion 509 by using any designating method (for example, setting by right clicking) when reaching desired magnification.

In addition, the observation position displaying portion 203 includes a stage rotation angle indicator 510. The stage rotation angle indicator 510 indicates a rotation angle obtained when an R-axis stage is rotated such that an orientation of the sample 103 is rotated. The display processing unit 117 rotates the stage rotation angle indicator 510 around the center of the observation position displaying portion 203 depending on the rotation of the R-axis stage. In this manner, the user can easily find the rotation angle of the R-axis stage.

As illustrated in FIG. 10, the first image 511 and the second image 512 are superimposed on each other in some cases. In such a case, a front/back relationship of the first image 511 and the second image 512 may be switched depending on necessary information. For example, in FIG. 10, the first image 511 having the high magnification is displayed in front of the second image 512 having the low magnification. In this manner, since the image (first image 511 having the high magnification) with more information is displayed in front the observation position displaying portion 203 even when the images have the same visual field, an amount of information for identifying the observation position increases whenever an image is imported and superimposed on the observation position displaying portion 203. The front/back relationship of the images may be changed by a condition. For example, in a case of the sample 103 that is changed with time, the display processing unit 117 may display the latest captured image in front. In this manner, it is possible to identify the observation position from an image showing a state close to the current state of the sample 103 during the observation.

In addition, depending on an observation condition of the charged particle beam apparatus such as a degree of vacuum, an acceleration voltage, and a beam diameter on the sample, the display processing unit 117 may control the front/back relationship of a plurality of images. For example, in a case where the degree of vacuum is low, an electron beam is scattered in general, and an image having poor visibility is acquired. The display processing unit 117 acquires information of the degree of vacuum as an observation condition. The display processing unit 117 may display an image on the observation position displaying portion 203, which is imported when the degree of vacuum is high, in front of an image imported when the degree of vacuum is low.

As another example, the display processing unit 117 may preferentially display an image on the observation position displaying portion 203, which is imported when the acceleration voltage is high, in front. In this case, the user can preferentially see the image having high resolution. On the other hand, the display processing unit 117 may preferentially display an image on the observation position displaying portion 203, which is imported when the acceleration voltage is low, in front. In this case, the user can preferentially see the information on a front surface of the sample.

It is also possible to expect the same effects about the beam diameter on the sample. In a case where the user wants to preferentially display the image having the high resolution even the image has much noise, the display processing unit 117 may preferentially display an image on the observation position displaying portion 203, which is imported when the beam diameter on the sample is small, in front. On the other hand, in a case where the user wants to preferentially display an image that has less noise and is easier to be seen, the display processing unit 117 may preferentially display an image on the observation position displaying portion 203, which is imported when the beam diameter on the sample is large, in front.

The charged particle beam apparatus may include a plurality of detectors not illustrated in FIG. 1. In this case, observation images are acquired while the plurality of detectors are switched. Since the observation position displaying image is not limited to a signal of a specific detector, images acquired by a plurality of types of detectors are simultaneously arranged on the observation position displaying portion 203 in some cases. When the types of detectors are different, appearances are significantly different from each other in some cases even when the same sample is detected. In this case, the observation position displaying image does not correspond to the observation image in some cases. In order to solve such a problem, the display processing unit 117 may preferentially display an image on the observation position displaying portion 203, which is acquired by a currently selected detector, in front. In this manner, the observation image and the image on the observation position displaying portion 203 look alike and can show the accurate observation position.

The control of the front/back relationship of the image described above may be automatically switched by the control and calculation unit 111 depending on an observation object and a purpose of the apparatus or may be selected by the user.

In addition, a display method of the images on the observation position displaying portion 203 is not limited to the simple superimposition of the images. For example, the display processing unit 117 may cause a transmission type image to be displayed in front of the plurality of images. According to this method, the user can see information of the images on the back side, and it is possible to show the user more information.

In addition, the display processing unit 117 may add pseudo colors to the plurality of images. For example, in a case of images of signals from which composition information is obtained, the display processing unit 117 may add pseudo colors to the images depending on composition and may superimpose the images on the observation position displaying portion 203. In this manner, the user can find not only information of a shape but also a difference in composition at a glance, and thus it is possible to show the user more information.

In addition, in a case where the charged particle beam apparatus includes the plurality of detectors, the display processing unit 117 may add different pseudo colors to the images that are obtained in response to signals from different detectors. The display processing unit 117 may superimpose and display the images.

In addition, in a case of images of signals that include much edge information, the display processing unit 117 may generate images obtained by picking out only edge portions and may superimpose the plurality of images, in which the edge is highlighted, on the observation position displaying portion 203. In this manner, the visibility in the image improves.

In the configurations described above, the images captured by the charged particle beam apparatus are described; however, an image used for an observation position display is not limit to an image obtained by the charged particle beam apparatus and may be an image of an observation sample like an image obtained from a camera, an optical microscope, a fluorescence microscope, a laser microscope, or X-rays. In addition, not only the captured image but also a design drawing such as a CAD drawing may be used as the observation position display.

FIG. 12 illustrates an example in which an image captured by an optical camera is displayed on the observation position displaying portion 203. For example, an optical camera 143 is mounted in an upper side of the sample chamber 101 (refer to FIG. 1). The display processing unit 117 acquires an optical image 601 captured by the optical camera 143 and displays the optical image 601 on the observation position displaying portion 203. The image that is displayed on the observation position displaying portion 203 is not limited to an image captured by the camera and may be any image related to the sample 103. For example, the display processing unit 117 may display, on the observation position displaying portion 203, both or by switching a drawing showing a shape of the sample or an image of a type of signal different from a signal used for the observation and or to another image.

In the example in FIG. 12, the display processing unit 117 trims the optical image 601 on the bases of the shape of the sample stage 104 and displays the optical image 601 on the observation position displaying portion 203. According to the configuration, it is possible to remove unnecessary information on an outer side from the outline of the sample stage 104 and to show the user an observation position in a state in which the sample is close to the real sample. The optical image 601 may be superimposed on the sample stage simulating FIG. 501 in FIG. 10. In addition, as another example, the sample stage simulating FIG. 501 may be replaced with the optical image 601.

In this manner, before the observation is performed by the charged particle beam apparatus, the user can find substantial information of the entire sample. The user can designate a region in which the user is interested while watching the optical image 601 of the entire sample and import an observation images of the region on the observation position displaying portion 203. In this manner, it is possible to generate a map on which the observation image is superimposed on the optical image 601.

When a color image like an optical image is imported on the observation position displaying portion 203 and digitally zooms in, a problem arises in that not only the image is blurred but also colors are blurred. Therefore, when the magnification of the observation position displaying portion 203 exceeds a threshold value, the display processing unit 117 may replace a color image with a grayscale image. In this manner, it is possible to perform the zoom-in display without deterioration of the visibility.

FIGS. 13 to 15 illustrate a first example of controlling the magnification of the observation image and the magnification of the observation position displaying portion 203 in conjunction with each other. The operation screen includes a magnification conjunction function executing portion 701. The magnification conjunction function executing portion 701 is used to match the magnification of the observation image on the observation image displaying portion 201 and the magnification of the observation position displaying portion 203. In the state in FIG. 13, the user clicks the magnification conjunction function executing portion 701 by using the input unit 116. When the setting processing unit 118 receives the input, the setting processing unit controls the constituent elements of the charged particle beam apparatus such that the magnification of the observation image matches the magnification of the observation position displaying portion 203. The display processing unit 117 displays the observation image obtained after the magnification correction on the observation image displaying portion 201 (FIG. 14). According to the function, it is possible to reduce damage to the sample during the search for the observation position. In addition, after the observation position is substantially determined in the state in FIG. 14, the user can designate a detailed observation position as illustrated in FIG. 15.

FIGS. 16 and 17 illustrate a second example of controlling of the magnification of the observation image and the magnification of the observation position displaying portion 203 in conjunction with each other. FIG. 17 illustrates a state in which the magnification of the observation image is increased from the state in FIG. 16. The display processing unit 117 performs control such that the magnification of the observation image and the magnification of the observation position displaying portion 203 are relatively constant. In the example, regardless of the magnification of the observation image displaying portion 201, the observation position indicator 207 is displayed to have a constant display size. In a state in which the magnification of the observation position displaying portion 203 is slightly lower than the magnification of the observation image on the observation image displaying portion 201, the display processing unit 117 displays the observation position displaying image. According to the configuration, there is no need to adjust the magnification of the observation position displaying portion 203, and thus it is possible to simplify the operation performed by the user. The operation screen includes a magnification conjunction function executing portion 801 on which it is possible to switch the control described above to enablement/disablement. On the magnification conjunction function executing portion 801, it is possible to switch the control to the enablement/disablement; however, the control described above may be always enable.

FIG. 18 illustrates the observation position displaying portion 203 having a configuration that is further increased from the configuration in FIG. 10. The observation position displaying portion 203 includes an observation image non-displaying function 901 and a Z-direction image switching function 902. The observation image non-displaying function 901 is a function of switching the charged particle beam irradiation to the sample 103 to enablement/disablement. The user clicks the magnification conjunction function executing portion 701 by using the input unit 116. When the setting processing unit 118 receives the input, the setting processing unit controls the irradiation with the charged particle beam. For example, voltage application to the charged particle source (for example, an electron gun) may be stopped or control the deflector 108 such that the sample 103 is not irradiated with the charged particle beam. For example, when a state of irradiation with the charged particle beam is maintained when the observation position is positioned, damage to the sample increases. Hence, the user may cause the observation image non-displaying function 901 to be enable. In this case, the observation image is not displayed on the observation image displaying portion 201, but only the observation position displaying portion 203 is displayed. In this manner, it is possible to move to the observation position without unnecessary damage to the sample. In particular, the configuration is particularly effective to an apparatus using a beam having a large influence on the sample, such as a focused ion beam.

In addition, the Z-direction image switching function 902 is a function of hierarchizing the observation position displaying portion 203 and switching display for each hierarchy. For example, the observation position displaying image may be imported for each acceleration voltage and a plurality of observation position displaying images may be hierarchized to be accumulated in the main storage device 114 or the secondary storage device 115. The display processing unit 117 displays the plurality of hierarchized observation position displaying images depending on an operation of a button of the Z-direction image switching function 902. For example, when an upward button of the Z-direction image switching function 902 is clicked, the display processing unit 117 displays the observation position displaying image at one hierarchy above. According to the configuration, it is possible to switch information to information of the surface of the sample and information of the inside of the sample. In addition, in a case where the observation is performed while the surface is scraped through cutting the sample by the focused ion beam or a diamond knife, the observation position displaying images are acquired before the sample 103 is processed, and the images are hierarchized and stored. According to the configuration, while the sample 103 is processed, it is possible to check the structure, which has already been eliminated, again on the observation position displaying portion 203.

The display processing unit 117 may switch the display and the non-display of the observation position displaying image depending on the observation condition (a value of the acceleration voltage, the degree of vacuum, a detector, or the like). In this case, the observation position displaying image may be accumulated in the main storage device 114 or the secondary storage device 115 in association with the observation condition. In addition, the observation position displaying portion 203 may include an input form for designating the observation condition.

The observation position displaying image and the coordinate information of the observation position displaying portion 203 described in FIGS. 2 to 18 can be reproduced without using the charged particle beam apparatus after the observation is performed by the apparatus. For example, the observation position displaying image and the coordinate information accumulated in the secondary storage device 115 may be referred to by an apparatus other than the charged particle beam apparatus. In this manner, in a case where a user wants to perform the observation again later, there is no need to use the charged particle beam apparatus and it is possible to perform the observation by the charged particle beam apparatus in a pseudo manner.

The observation position indicator 207 described in FIGS. to 18 is disposed at a position fixed on the observation position displaying portion 203; however, the indicator is not limited the configuration. FIG. 19 illustrates another configuration of the observation position indicator 207. As illustrated in FIG. 19, the display processing unit 117 may move the observation position indicator 207 to a corresponding observation position in association with the movement of the observation position. A relationship between the magnifications and the coordinates of the observation image displaying portion 201 and the observation position displaying portion 203 is maintained, the observation position indicator 207 may be displayed in another form.

Second Example

FIG. 20 illustrates an example in which a positional relationship between a plurality of detectors is displayed on the observation position displaying portion 203. In the example, the charged particle beam apparatus includes an energy dispersive X-ray spectrometry (EDX) detector, a reflected electron detector, a secondary electron detector, and a camera. A first detector position display 1101, a second detector position display 1102, a third detector position display 1103, and a camera position display 1104 are displayed on the observation position displaying portion 203. The first detector position display 1101 represents a position of the EDX detector disposed in the sample chamber 101. The second detector position display 1102 represents a position of the reflected electron detector disposed in the sample chamber 101 and also has a function of switching the signals of the observation images. The third detector position display 1103 represents a position of the secondary electron detector disposed in the sample chamber 101 and also has a function of switching the signals of the observation images. The camera position display 1104 represents a position of the camera for observing the inside of the sample chamber and also has a function of switching a signal to a camera video.

For example, when the user clicks the second detector position display 1102 by using the input unit 116, the display processing unit 117 switches the observation image on the observation image displaying portion 201 to an observation image in response to a signal from the reflected electron detector. On the other hand, when the user clicks the camera position display 1104 by using the input unit 116, the display processing unit 117 switches the observation image on the observation image displaying portion 201 to an image from the camera. As described above, it is possible to switch the observation image by using marks of the plurality of detectors and the camera in the observation position displaying portion 203.

The display processing unit 117 may display a currently selected detector and an unselected detector in different display forms. For example, the display processing unit 117 may display the currently selected detector and the unselected detector in different colors. In this manner, the user can find which detector outputs a detection signal in response to which the current observation image is obtained.

The image from the camera for observing the inside of the sample chamber may be displayed on the observation image displaying portion 201 or may be displayed as an assisting function on the observation position displaying portion 203.

The display processing unit 117 may display a message when the marks of the plurality of detectors and the camera in the observation position displaying portion 203 are clicked depending on the observation condition. For example, the detectors may include a detector that is not able to be used in a condition. For example, the secondary electron detector in the electron microscope is not able to be used in low vacuum. In a case where the inside of the sample chamber 101 is in low vacuum and the user clicks the third detector position display 1103 by using the input unit 116, the display processing unit 117 displays a state displaying portion 1105. A message such as "not usable in low vacuum" is displayed on the state displaying portion 1105. In this manner, when the user tries to select a detector, it is possible to show reasons why the detector cannot be used. A user who is not familiar with the apparatus can easily understand the state of the apparatus or the like.

The display processing unit 117 may display a currently selectable detector and a detector that is not currently selectable under the observation condition in different display forms. For example, the display processing unit 117 may display the currently selectable detector and the detector that is not currently selectable under the observation condition in different colors.

The first detector position display 1101, the second detector position display 1102, the third detector position display 1103, and the camera position display 1104 may be controlled so as to always maintain a relationship with the observation position displaying portion 203. For example, in a case where the R-axis stage is rotated, the display processing unit 117 rotates the first image 511 and the second image 512 and the stage rotation angle indicator 510; however, the position displays 1101 to 1104 are not rotated.

On the other hand, in a case of a scanning type charged particle beam apparatus, a scanning direction is controlled, and thereby it is possible to rotate the observation image. In this case, the display processing unit 117 rotates all of the first image 511, the second image 512, the stage rotation angle indicator 510, and the position displays 1101 to 1104 depending on the control in the scanning direction.

Hereinafter, effects of the examples described above will be described. In the related art, a method for providing the one low-magnification image or the observation position on the connected low-magnification image is used; however, it is difficult to identify the observation position in a case where the magnification of the visual field on the screen of the low-magnification image or the connected image significantly differs from the magnification of the observation field in which observation is currently performed in such a method. In addition, even in a method for providing an observation position by switching a plurality of low-magnification images, an image for displaying observation position is not suitable for the magnification at which the image is currently observed in some cases.

In this respect, the charged particle beam apparatus including the observation assisting function of the example described above includes the optical system 102 that irradiates the observation sample with the charged particle beam generated from the charged particle source, the sample stage 104 on which the sample 103 is mounted, the stage 105 that moves the sample stage and the deflector 108 that changes the charged particle beam irradiation position, the detector 106 that detects a signal that is generated from the sample 103 by irradiation with the charged particle beam, and the imaging device 110 that converts the signal acquired by the detector 106 into an image. The plurality of observation position displaying images having different magnifications are displayed on the observation position displaying portion 203 which can zoom in and out, based on an apparatus coordinate system during the capturing. In this manner, it is possible to display the low-magnification image and the high-magnification image on the observation position displaying portion 203. In addition, it is possible to check the observation position by zooming in to and out from the observation position displaying portion 203. In this manner, it is possible to provide the observation position even when the magnification at which the current observation is performed (magnification of the observation image) is significantly different from the magnification of the image that displays the observation position, and it is possible to show the user the position at which the current observation is performed, regardless of the magnification of the observation.

In addition, in a method in which an observation position is provided on a connected image of the continuous images of a region, since the sample is irradiated with the charged particle beam in relation to regions, a problem arises in that damage to the sample increases, and further a problem arises in that a throughput is degraded in order to capture the plurality of unnecessary images. In this respect, according to the example, since the minimum necessary number of images required to provide the observation position may be acquired, it is possible to reduce the damage to the sample.

In addition, since the minimum necessary number of images may be acquired, the throughput in the observation improves.

The example described above has the following additional characteristics. The display processing unit 117 may move a display position of the observation position displaying image on the observation position displaying portion 203, in conjunction with the movement by the stage 105 or the movement of the irradiation position of the charged particle beam by the deflector 108. In this manner, the user can check the change in irradiation position on the observation position displaying portion 203 in real time.

In addition, the observation position displaying portion 203 can receives visual field movement designation by the user. When the setting processing unit 118 receives the visual field movement designation, the setting processing unit controls the stage 105 or the deflector 108 such that the visual field is moved to the designated visual field. In this manner, it is possible to change the observation field on the observation position displaying portion 203, and thus the operability improves.

In addition, the stage 105 includes the R-axis stage. When the sample stage 104 rotates by the R-axis stage, the display processing unit 117 rotates the observation position displaying image with reference to a rotation center position of the R-axis stage on the observation position displaying portion 203. In this manner, the observation position displaying image rotates similarly to the real observation image, and thereby it is easy for the user to identify the observation position on the observation position displaying portion 203.

In addition, in the charged particle beam apparatus, the optical system 102 has a function of changing a scanning direction of the charged particle beam and rotating the image. When the scanning direction of the charged particle beam is changed, the display processing unit 117 rotates the observation position displaying image on the observation position displaying portion 203 around the observation position. In this manner, the observation position displaying image rotates similarly to the real observation image, and thereby it is easy for the user to identify the observation position on the observation position displaying portion 203.

In addition, the display processing unit 117 displays the sample stage simulating FIG. 501 that simulates the sample stage 104 on the observation position displaying portion 203. The display processing unit 117 superimposes and displays the observation position displaying images on the sample stage simulating FIG. 501 on the observation position displaying portion 203. In this manner, the user can find a state of the inside of the sample chamber 101 with intuition.

In addition, the display processing unit 117 displays the sample chamber cross-section simulating FIG. 502 that simulates the cross section of the sample chamber on the observation position displaying portion 203. The display processing unit 117 superimposes and displays the sample stage simulating FIG. 501, the sample chamber cross-section simulating FIG. 502, and the observation position displaying images on the observation position displaying portion 203. In this manner, it is possible to intuitively show the user the position and the direction of the sample in the sample chamber 101.

In addition, the display processing unit 117 displays, on the observation position displaying portion 203, the observation position indicator 207 representing the observation position. The observation position indicator 207 zooms in/out depending on the magnification of the observation of the apparatus and the magnification of the observation position displaying portion 203. In this manner, the user can check the observation field with a desired size.

In addition, the observation position displaying portion 203 includes the observation image importing portion 202 on which the user maintains an observation image at will. Hence, the user can maintain the necessary minimum number of observation position displaying images. In particular, in the related art, as the observation position displaying image, one low-magnification image is acquired in advance or a plurality of low-magnification images are automatically acquired in a process, and thus it is not possible to acquire the appropriate observation position displaying image. In this respect, in the example, the user can acquire the observation position displaying image at the desired magnification and position and can generate the observation position displaying map having a larger amount of information in the region in which the user is interested.

In addition, the observation position displaying portion 203 includes the continuous image importing portion 504. When the continuous image importing portion 504 receives an input, the setting processing unit 118 controls the stage 105 or the deflector 108 such that the entire region of the sample stage 104 is imaged. The display processing unit 117 arranges the plurality of captured images on the observation position displaying portion 203 depending on coordinates of positions of the images. In this manner, in a case where the images of the entire region of the sample stage 104 are acquired as the observation position displaying images, the user can acquire the images automatically and the user can reduce the time and effort.

In addition, the charged particle beam apparatus includes an imaging system other than the charged particle beam imaging system that is used during the observation. In the examples described above, the optical camera 143 is used as the imaging system; however, another imaging system may be used. The display processing unit 117 may display, on the observation position displaying portion 203, both or by switching the drawing showing the shape of the sample or an image of a type of signal different from the signal used during the observation and or to another image. The display processing unit 117 may perform display by removing unnecessary information on the outer side from the outline of the sample stage 104 related to the image captured by the imaging system other than a charged particle beam imaging system. For example, the display processing unit 117 may cut out portions of the sample stage 104 and may display the rest of the sample stage 104 on the observation position displaying portion 203, in relation to the image captured by the imaging system other than a charged particle beam imaging system. For example, the display processing unit 117 superimposes and displays the image captured by the imaging system other than the charged particle beam imaging system on the sample stage simulating FIG. 501; however, the sample stage simulating FIG. 501 may be replace and displayed with the image captured by the imaging system other than the charged particle beam imaging system.

In addition, the display processing unit 117 may change the sample stage simulating FIG. 501 or the image captured by the imaging system other than the charged particle beam imaging system depending on the size of the sample stage 104 during the observation. In addition, the display processing unit 117 may change the size that is the reference of the image, on the observation position displaying portion 203, depending on the size of the sample stage 104 during the observation.

In addition, the display processing unit 117 displays an indicator (the deflection degree displaying indicator 505) of a deflection degree for moving the visual field during the observation, on the observation position displaying portion 203. In this manner, the user can always find a difference in stage coordinate. In addition, when the setting processing unit 118 receives an input to the deflection degree displaying indicator 505, the setting processing unit cancels the deflection by the deflector 108 and the stage coordinate is coincident with the observation position.

In addition, in a case where the color image is displayed as the observation position displaying image, the display processing unit 117 may switch and display the color images to the grayscale displays depending on a magnification ratio of the observation position displaying portion 203.

In addition, the observation position displaying portion 203 has a function of designating the observation position by clicking. The display processing unit 117 displays a frame indicating a stage movable range (the movable range frame 507) on the observation position displaying portion 203. When the outer side from the stage movable range is clicked, the display processing unit 117 may display a warning message indicating that the click is out of the stage movement range. In this manner, when the observation position is designated on the observation position displaying portion 203, it is possible to find a range in which it is possible to designate the observation position.

In addition, the observation position displaying portion 203 has a function of designating the observation position by the drag and drop. When the user drag and drops the observation position displaying portion 203, the display processing unit 117 restricts that the central position of the observation position displaying portion 203 does not move to the outer side of the movable range frame 507.

In addition, the observation position displaying portion 203 includes the coordinate registering portion 508 as the coordinate registering function. When the coordinate registering portion 508 is clicked, the display processing unit 117 may store the coordinate of the observation position designated by the observation position displaying portion 203 and may display the marks indicating the registration position on the observation position displaying portion 203. The display processing unit 117 moves the mark along with the observation position displaying image, in association with the movement of the observation position.

In addition, when the observation position displaying image is imported on the observation position displaying portion 203 by the observation image importing portion 202, the display processing unit 117 changes the magnification of the observation position displaying portion 203 such that the imported observation position displaying image is displayed on the entire region of the observation position displaying portion 203.

The observation position displaying portion 203 includes the magnification changing portion 509 for immediately setting the magnification of the observation position displaying portion 203 to a predesignated value. The observation position displaying portion 203 may have a function of designating and setting the magnification set in advance while the user checks the observation position displaying portion 203.

In addition, the display processing unit 117 may change the front/back relationship between the plurality of the observation position displaying images which are superimposed and disposed on the observation position displaying portion 203 depending on the designation or the observation condition of the user. For example, the display processing unit 117 may display the observation position displaying image having the high magnification during the observation in front, of the plurality of observation position displaying images. For example, the display processing unit 117 may display the observation position displaying image imported later, in front, of the plurality of observation position displaying images. For example, the display processing unit 117 may display the observation position displaying image selected by a mouse, a keyboard, or a user interface device such as a touch panel, in front. The display processing unit 117 may display the image obtained in response to a specific detection signal in front, of the plurality of observation position displaying images. The display processing unit 117 may switch the front/back relationship of the plurality of observation position displaying images depending on the degree of vacuum during the observation in front. The display processing unit 117 may switch the front/back relationship of the plurality of observation position displaying images depending on the acceleration voltage during the observation.

In addition, the display processing unit 117 may add pseudo colors to the signals obtained in response to the images from the different detectors and may superimpose and display the images.

In addition, the observation position displaying portion 203 has a function of hierarchizing and displaying the plurality of observation position displaying images. When a button of the Z-direction image switching function 902 is clicked, the display processing unit 117 displays the observation position displaying image for each hierarchy.

In addition, the display processing unit 117 may switch the display and the non-display of the images depending on the observation condition (a value of the acceleration voltage, the degree of vacuum, a detector, or the like) in association with the observation position displaying image.

In addition, the display processing unit 117 may cause at least one transmission type image of the plurality of observation position displaying images and may superimpose the other images on the observation position displaying portion 203.

In addition, the display processing unit 117 may display the observation position displaying image captured at the high magnification in a frame when the magnification of the observation position displaying portion 203 is lower than that.

In addition, the display processing unit 117 may manage, as history, the coordinate at which the observation position displaying image is imported. The observation position displaying portion 203 has a function of designating the coordinate from the history. In this manner, it is possible to cause the position at which the observation position displaying image is imported, to reappear, and it is possible to easily reimage an observation position displaying image.

The observation position displaying image and the coordinate information of the observation position displaying portion 203 may be configured to be able to be referred to by another apparatus after the observation by the charged particle beam apparatus is ended. For example, the observation position displaying image and the coordinate information, may be stored in another storage device on the assist storage device or a network. In this manner, it is possible to reproduce the observation position displaying portion 203 without using the charged particle beam apparatus.

The observation position displaying portion 203 includes the magnification conjunction function executing portion 701 for matching the magnification of the observation image displaying portion 201 and the magnification of the observation position displaying portion 203. When the magnification conjunction function executing portion 701 is clicked, the setting processing unit 118 sets the magnification of the observation image to the same magnification as that of the observation position displaying portion 203.

The observation position displaying portion 203 includes the observation image non-displaying function 901 for switching the charged particle beam irradiation to the sample to enablement/disablement. When the observation image non-displaying function 901 is clicked, the setting processing unit 118 performs control such that the charged particle beam does not reach the sample 103. The setting processing unit 118 may stop the voltage application to the charged particle source or control the deflector 108 such that the sample 103 is not irradiated with the charged particle beam. In this manner, it is possible to reduce the damage to the sample.

In addition, the display processing unit 117 may be configured to reflect an amount of an image shift to the coordinate of the observation position displaying portion 203.

In addition, in a case where the observation position is changed by the stage 105 or the deflector 108, the display processing unit 117 may move the marker indicating the observation position on the observation position displaying portion 203 without moving the observation position displaying image.

In addition, the display processing unit 117 may embed the mark in the observation position displaying portion 203 and may display information (for example, a coordinate) of a point when the user moves a mouse over the mark.

The observation position displaying portion 203 displays the positional relationship between the plurality of detectors in the sample chamber 101 and includes an interface (a figure or a display) that can be used to switch the plurality of detectors. When the interface is clicked, the display processing unit 117 switches the observation image of the observation image displaying portion 201 to the observation image obtained in response to a signal from the clicked detector.

The display processing unit 117 may display the currently selected detector and the unselected detector in different display forms. For example, the display processing unit 117 may display the currently selected detector and the unselected detector in different colors. In this manner, the user can intuitively recognize the selected detector.

The display processing unit 117 may display the currently selectable detector and the detector that is not currently selectable under the observation condition in different display forms. For example, the display processing unit 117 may display the currently selectable detector and the detector that is not currently selectable under the observation condition in different colors. In this manner, the user can intuitively recognize the detector that cannot be selected.

In addition, the display processing unit 117 may switch the display/non-display of the figure or display depending on the positional relationship between the plurality of detectors. In this manner, when unnecessary, the positional relationship between the plurality of detectors can be non-displayed on the observation position displaying portion 203.

The present invention is not limited to the examples described above and includes various modification examples. The examples are described in detail for easy understanding of the present invention, and the present invention is not absolutely limited to inclusion of the entire configuration described above. In addition, it is possible to replace a part of a configuration of a certain example with a configuration of another example. In addition, it is possible to add a configuration of a certain example to a configuration of another example. For example, it is possible to improve the operability by combining the plurality of examples described above. In addition, it is possible to perform addition/removal/replacement of a configuration to/from/with a part of a configuration of each of the examples.

In addition, a part or the entirety of the configurations, the functions, the processing units, processing means, or the like may be realized by hardware by designing an integrated circuit, for example. In addition, the configurations, the functions, and the like described above may be realized with software by analyzing and performing programs by which processors realize respective functions. Information of a program, a table, or a file that realizes the functions can be stored in various types of non-transitory computer readable media. For example, a flexible disk, a CD-ROM, DVD-ROM, a hard disk, an optical disk, a magneto-optical disk, a CD-R, a magnetic tape, a nonvolatile memory card, a ROM, or the like is used as the non-transitory computer readable medium.

In the examples described above, control wires or information wires are illustrated when the wires are considered to be necessary for description, and all of the control wires or the information wires are not absolutely illustrated for a product. All of the configurations may be connected to each other.

REFERENCE SIGNS LIST

101: sample chamber
102: optical system
103: sample
104: sample stage
105: stage
106: detector
108: deflector
110: imaging device
111: control and calculation unit
112: display unit
113: CPU
114: main storage device
115: secondary storage device
116: input unit
117: display processing unit
118: setting processing unit
120: stage control device
130: deflection control device
201: observation image displaying portion
202: observation image importing portion
203: observation position displaying portion
205: observation magnification setting portion
206: observation position displaying portion-magnification setting portion
207: observation position indicator
501: sample stage simulating FIG.
502: sample chamber cross-section simulating FIG.
503: center indicator
504: continuous image importing portion
505: deflection degree displaying indicator
506: deflection canceling function
507: movable range frame
508: coordinate registering portion
509: magnification changing portion
510: stage rotation angle indicator
701: magnification conjunction function executing portion

801: magnification conjunction function executing portion
901: observation image non-displaying function
902: Z-direction image switching function

The invention claimed is:

1. A charged particle beam apparatus comprising:
an optical system that irradiates a sample mounted on a sample stage with a charged particle beam;
an imaging device that acquires an image by irradiating the sample with the charged particle beam; and
a controller that controls at least one of a stage that moves the sample stage and a deflector that changes an irradiation position of the charged particle beam to change an area of the image to be captured so as to output the image acquired by the imaging device to a display unit,
wherein the controller outputs:
a first image acquired by the imaging device at a first magnification to a first region of the display unit;
a second image acquired in a past by the imaging device at a second magnification lower than the first magnification to a second region of the display unit; and
the first image at higher resolution than that of the second image by superimposing it on the second image based on the irradiation position, when the first image output to the first region is additionally output to the second region,
wherein the controller displays the first image and the second image, in superimposition with a sample holder figure.

2. The charged particle beam apparatus according to claim 1, wherein the second region can display a wider area than the first region.

3. The charged particle beam apparatus according to claim 1, wherein a position corresponding to that of the first region is displayed on the second region.

* * * * *